US 12,159,954 B2

(12) United States Patent
Kokubun et al.

(10) Patent No.: US 12,159,954 B2
(45) Date of Patent: Dec. 3, 2024

(54) LIGHT DETECTOR

(71) Applicant: KABUSHIKI KAISHA TOSHIBA, Tokyo (JP)

(72) Inventors: Koichi Kokubun, Yokohama Kanagawa (JP); Nobu Matsumoto, Ebina Kanagawa (JP); Mitsuhiro Sengoku, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 490 days.

(21) Appl. No.: 17/446,395

(22) Filed: Aug. 30, 2021

(65) Prior Publication Data

US 2022/0310866 A1    Sep. 29, 2022

(30) Foreign Application Priority Data

Mar. 23, 2021  (JP) ................. 2021-049153

(51) Int. Cl.
| | | |
|---|---|---|
| *H01L 29/66* | (2006.01) | |
| *G01S 7/4863* | (2020.01) | |
| *H01L 21/02* | (2006.01) | |
| *H01L 21/033* | (2006.01) | |
| *H01L 21/28* | (2006.01) | |

(Continued)

(52) U.S. Cl.
CPC .......... *H01L 31/107* (2013.01); *G01S 7/4863* (2013.01); *H01L 27/14627* (2013.01); *H01L 27/14643* (2013.01)

(58) Field of Classification Search
CPC ......... H01L 27/14603; H01L 27/14609; H01L 27/14612; H01L 27/14643; G01S 7/4863; G01S 17/02-42
See application file for complete search history.

(56) References Cited

U.S. PATENT DOCUMENTS 10,014,332 B2   7/2018  Nishihara
2009/0173976 A1*  7/2009  Augusto ........... H01L 27/14669
                                             257/292

(Continued)

FOREIGN PATENT DOCUMENTS

EP    3 712 648 A2    9/2020
JP    2015-84392 A    4/2015

(Continued)

OTHER PUBLICATIONS

N. Akil et al. "A Multimechanism Model for Photon Generation by Silicon 24 Junctions in Avalanche Breakdown," IEEE Trans. on Electron Devices, vol. 46, No. 5, pp. 1022-1028 (1999).

(Continued)

*Primary Examiner* — John A Bodnar
(74) *Attorney, Agent, or Firm* — Finnegan, Henderson, Farabow, Garrett & Dunner, LLP

(57) ABSTRACT

A light detector according to one embodiment includes a substrate, a plurality of avalanche photodiodes, a well region, and a microlens array. The plurality of avalanche photodiodes are provided above the substrate. Each of the avalanche photodiodes is surrounded by a trench portion among a plurality of trench portions. The well region is provided between the trench portions that are adjacent to each other. The well region includes at least one of a transistor and a diode. The microlens array is provided to cover the avalanche photodiodes.

20 Claims, 24 Drawing Sheets

(51) Int. Cl.
*H01L 21/285* (2006.01)
*H01L 21/308* (2006.01)
*H01L 21/311* (2006.01)
*H01L 21/762* (2006.01)
*H01L 21/768* (2006.01)
*H01L 21/8234* (2006.01)
*H01L 21/8238* (2006.01)
*H01L 23/522* (2006.01)
*H01L 23/528* (2006.01)
*H01L 23/532* (2006.01)
*H01L 27/02* (2006.01)
*H01L 27/088* (2006.01)
*H01L 27/092* (2006.01)
*H01L 27/146* (2006.01)
*H01L 29/06* (2006.01)
*H01L 29/08* (2006.01)
*H01L 29/165* (2006.01)
*H01L 29/167* (2006.01)
*H01L 29/417* (2006.01)
*H01L 29/51* (2006.01)
*H01L 29/78* (2006.01)
*H01L 31/107* (2006.01)
*H10B 10/00* (2023.01)

(56) References Cited

U.S. PATENT DOCUMENTS

| | | |
|---|---|---|
| 2010/0148040 A1 | 6/2010 | Sanfilippo et al. |
| 2017/0301716 A1 | 10/2017 | Irish et al. |
| 2019/0355769 A1 | 11/2019 | Yajima |
| 2020/0025934 A1 | 1/2020 | Kwon et al. |
| 2020/0256961 A1 | 8/2020 | Gaalema et al. |
| 2020/0292670 A1 | 9/2020 | Kubota et al. |
| 2020/0292675 A1 | 9/2020 | Kubota et al. |
| 2020/0292677 A1 | 9/2020 | Kubota et al. |
| 2020/0300621 A1 | 9/2020 | Kubota et al. |
| 2020/0300985 A1 | 9/2020 | Kubota et al. |
| 2021/0029311 A1 | 1/2021 | Webster |
| 2021/0088635 A1 | 3/2021 | Kubota et al. |
| 2021/0134854 A1 | 5/2021 | Poikonen et al. |
| 2021/0296387 A1 | 9/2021 | Tsuchiya et al. |
| 2022/0013550 A1* | 1/2022 | Sugiura ............... H01L 27/1461 |
| 2022/0075037 A1 | 3/2022 | Kubota et al. |

FOREIGN PATENT DOCUMENTS

| | | |
|---|---|---|
| JP | 2015-179087 A | 10/2015 |
| JP | WO2016/017305 A1 | 2/2016 |
| JP | 2020-13950 A | 1/2020 |
| JP | 2020-515085 A | 5/2020 |
| JP | 2020-148644 A | 9/2020 |
| JP | 2020-148670 A | 9/2020 |
| JP | 2020-150128 A | 9/2020 |
| JP | 2020-153746 A | 9/2020 |
| JP | 2020-153929 A | 9/2020 |
| JP | 2020-161736 A | 10/2020 |
| JP | 2021-47131 A | 3/2021 |
| JP | 2022-44340 A | 3/2022 |
| WO | WO 2020/017180 A1 | 1/2020 |
| WO | WO 2929/017188 A1 | 1/2020 |

OTHER PUBLICATIONS

Japan Patent Office, Office Action in JP App. No. 2021-049153, 4 pages, and machine translation, 4 pages (Apr. 23, 2024).

* cited by examiner

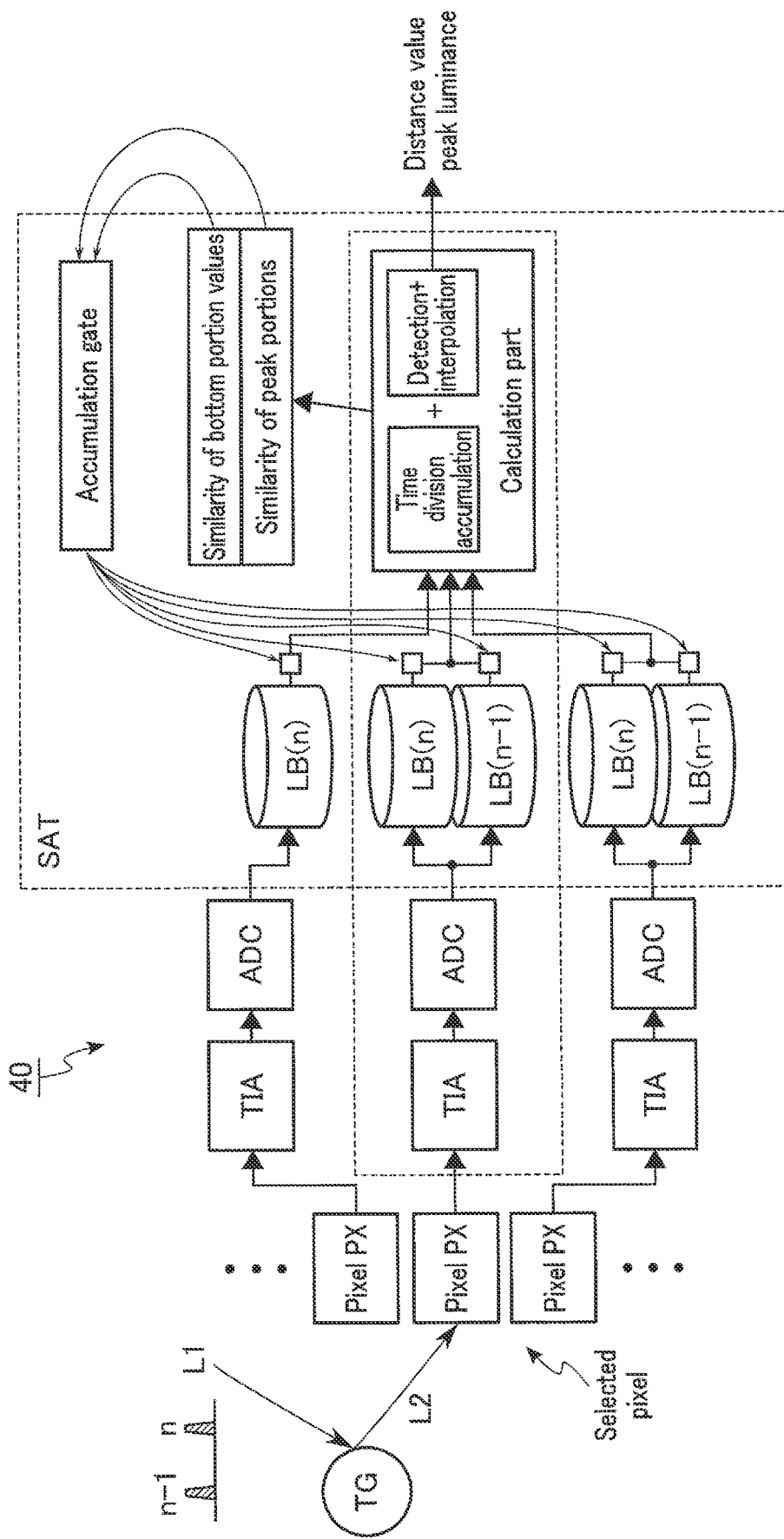
F I G. 6

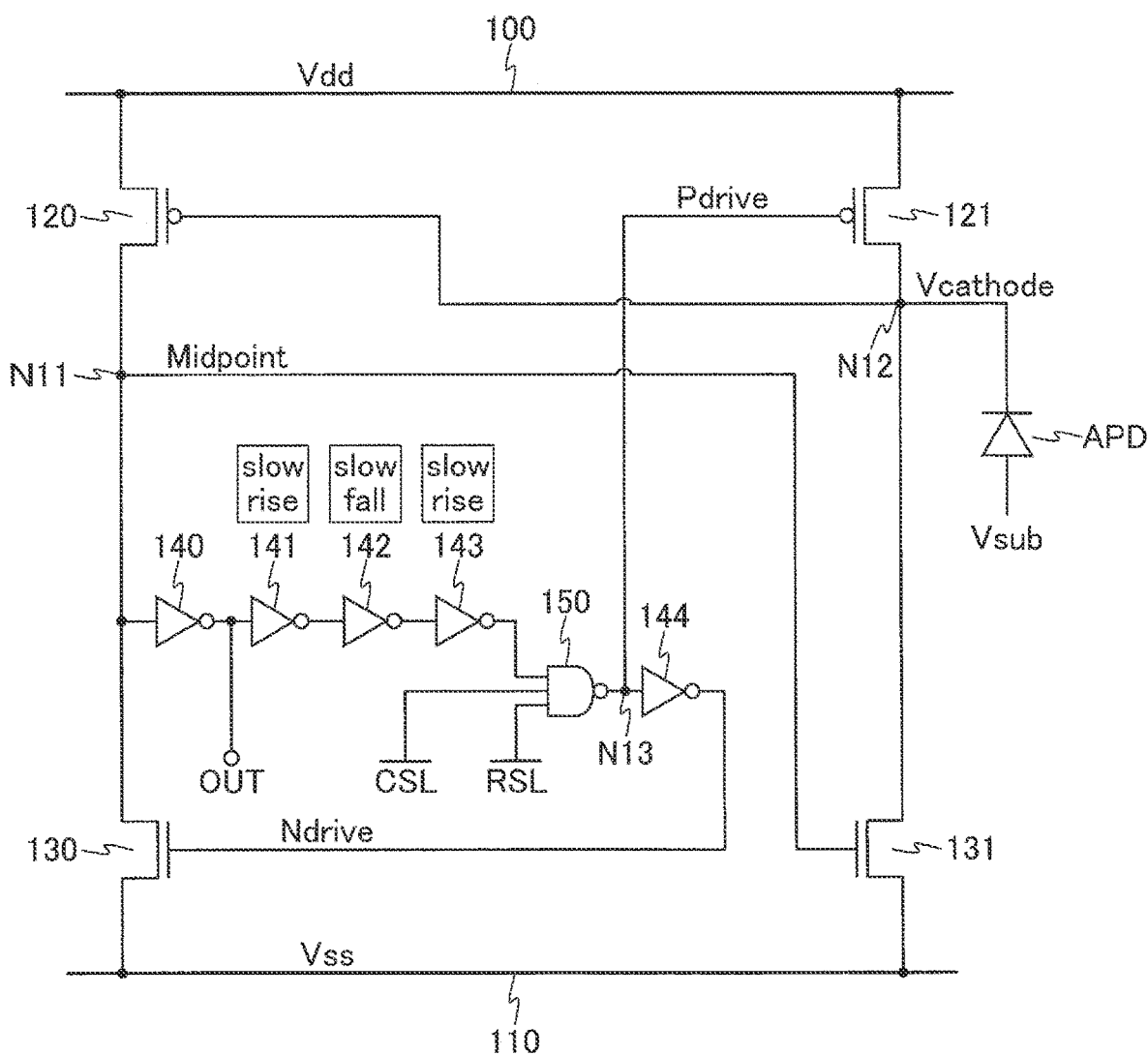
F I G. 9

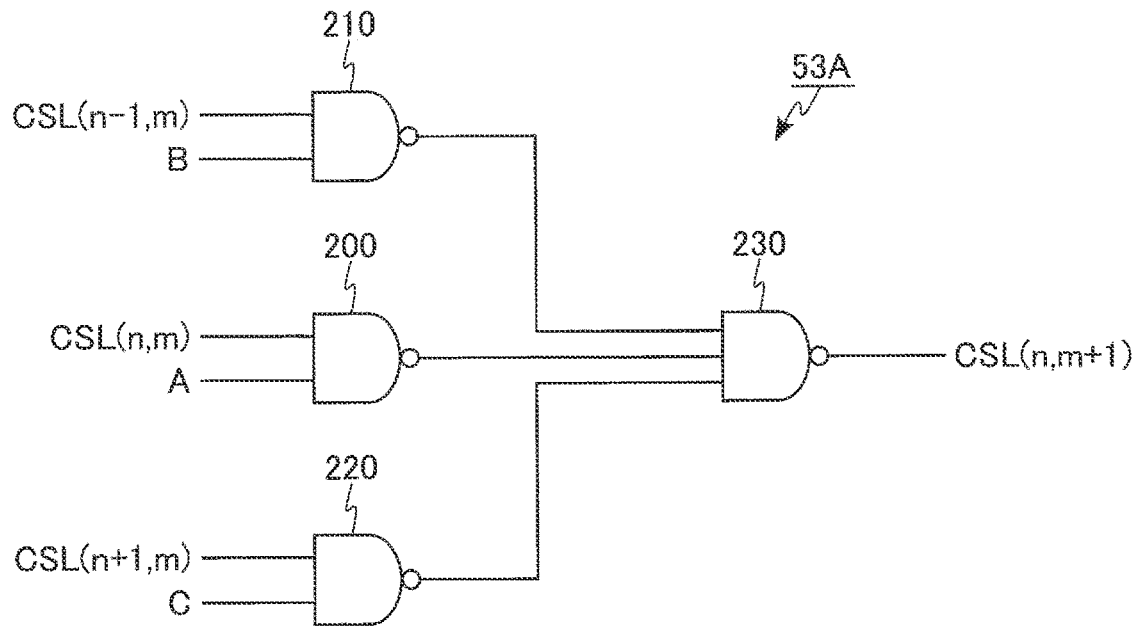
F I G. 11
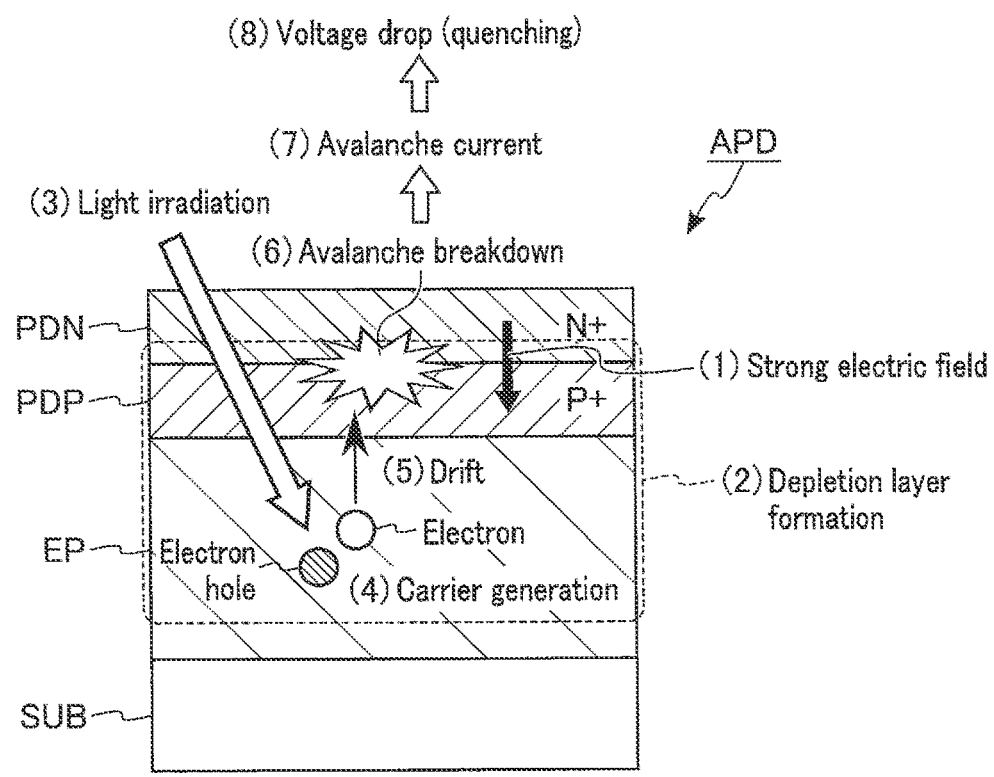
F I G. 12

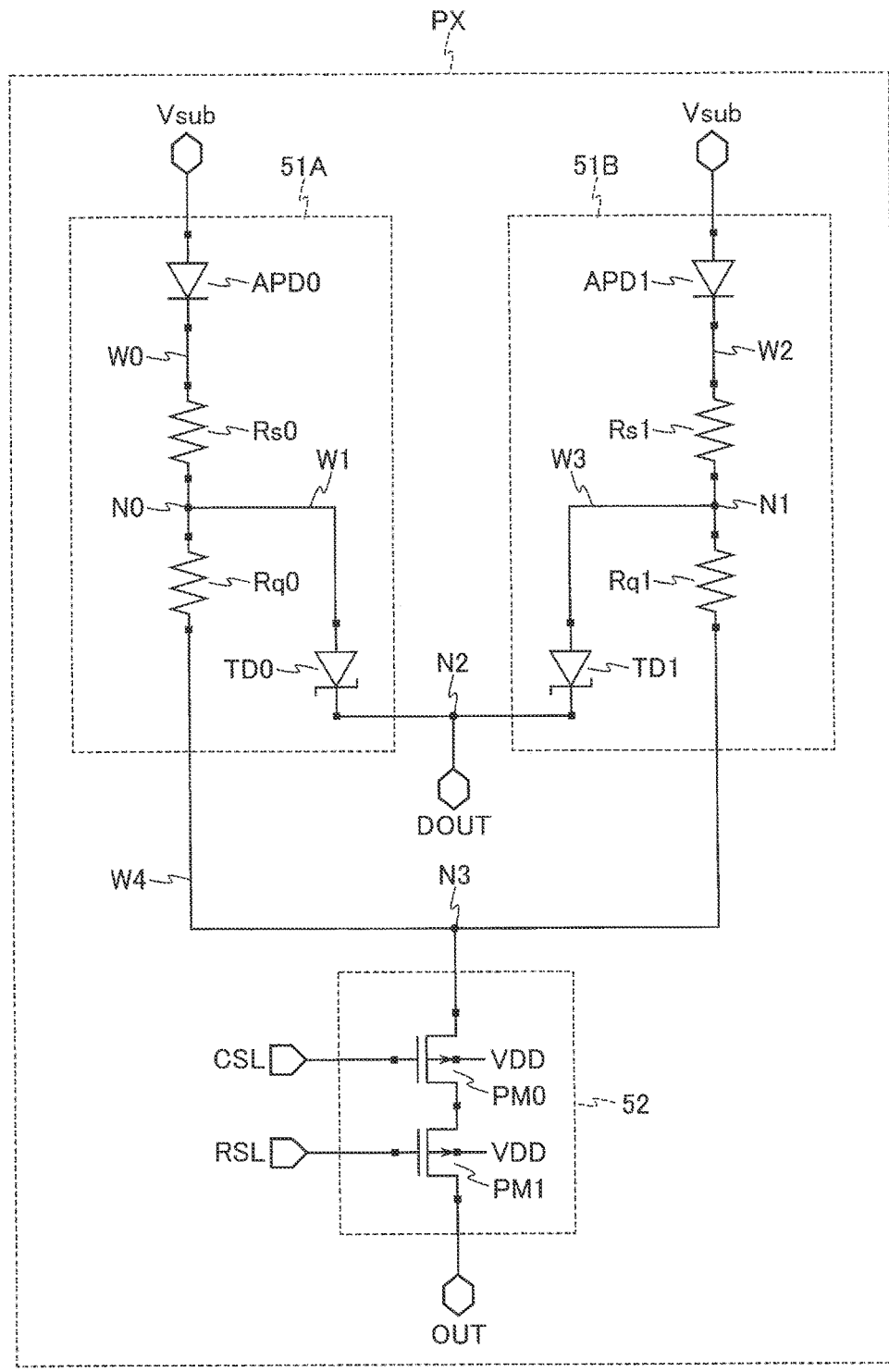
F I G. 25

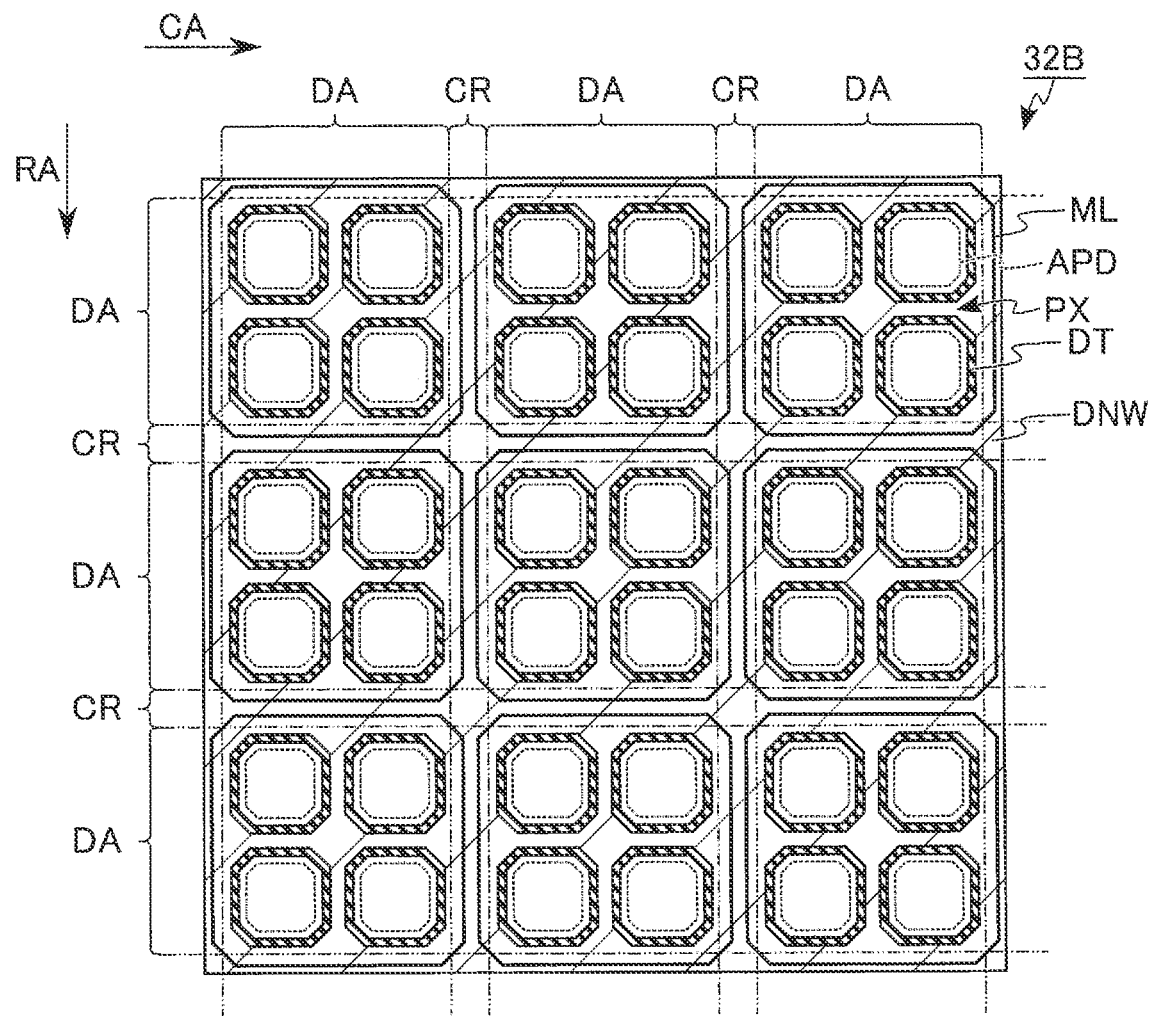
F I G. 28

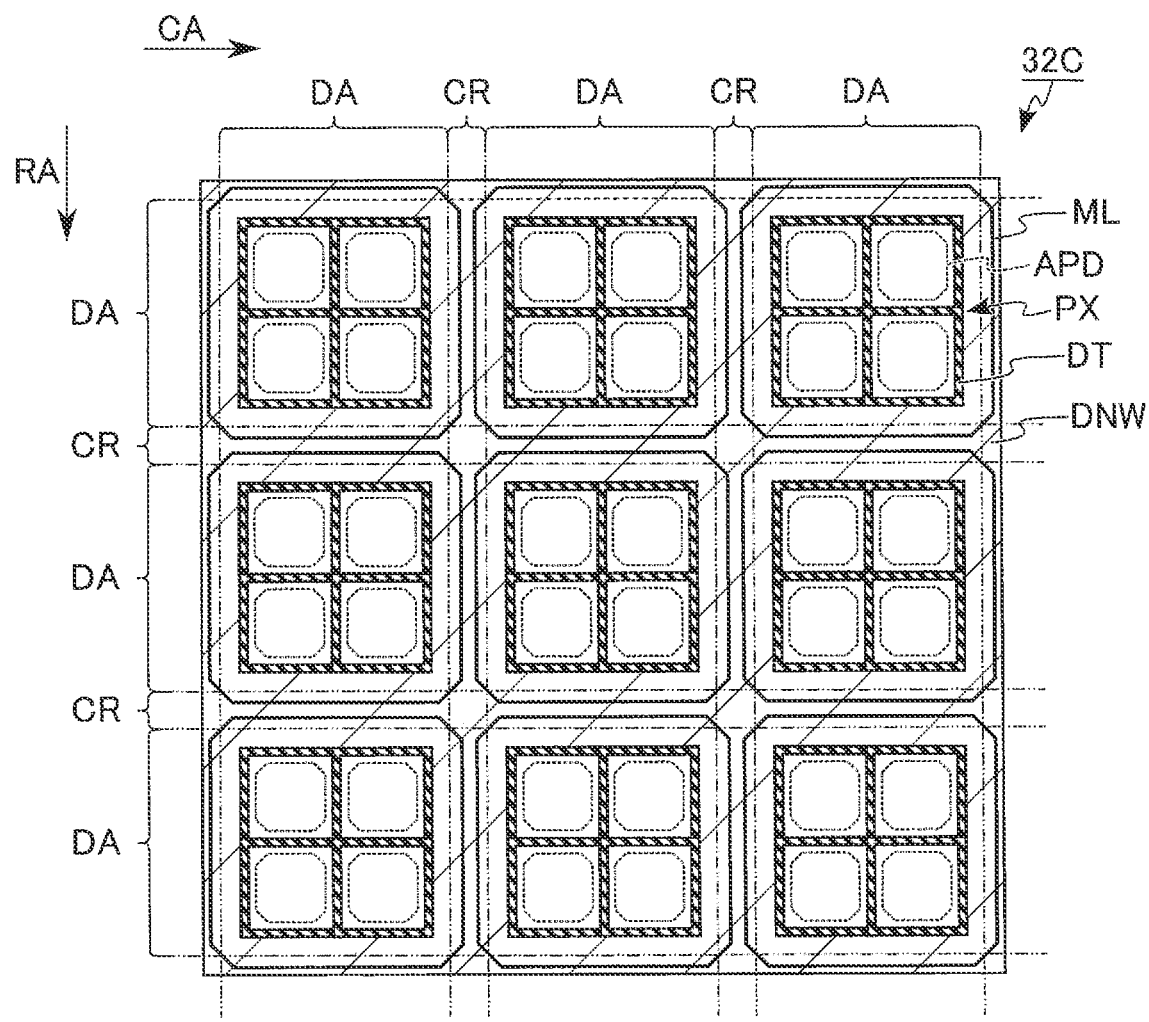
F I G. 29

LIGHT DETECTOR

CROSS-REFERENCE TO RELATED APPLICATIONS

This application is based upon and claims the benefit of priority from Japanese Patent Application No. 2021-049153, filed Mar. 23, 2021, the entire contents of which are incorporated herein by reference.

FIELD

Embodiments described herein relate generally to a light detector.

BACKGROUND

A distance measuring device called "LiDAR (Light Detection and Ranging)" is known. A LiDAR irradiates a target object with laser light, and detects the intensity of reflected light reflected from the target object by a sensor (light detector). Then, the LiDAR measures a distance from itself to the target object based on a light intensity signal output from the sensor. There are a number of sensors used in the LiDAR, but a two-dimensional sensor (2D sensor) comprising a plurality of silicon photomultipliers arrayed two-dimensionally is known to be a promising sensor for the future.

BRIEF DESCRIPTION OF THE DRAWINGS

FIG. 6 depicts a schematic diagram showing an example of a configuration of a measurement section included in the distance measuring device according to the first embodiment.

FIG. 9 depicts a circuit diagram showing an example of circuit configurations of a selection circuit and an APD unit in a modification of the first embodiment.

FIG. 11 depicts a circuit diagram showing an example of another configuration example of the shift circuit included in the pixel included in the light detector according to the first embodiment.

FIG. 12 depicts a schematic diagram showing an example of a structure of an avalanche photodiode and an operation principle of a single-photon avalanche diode included in the light detector according to the first embodiment.

FIG. 25 depicts a circuit diagram showing an example of circuit configurations of an APD unit and a selection circuit included in a pixel included in a light detector according to a second embodiment.

FIG. 28 depicts a plan view showing an example of a planar layout of a light receiver included in a light detector according to a first modification of the first embodiment.

FIG. 29 depicts a plan view showing an example of a planar layout of a light receiver included in a light detector according to a second modification of the first embodiment.

DETAILED DESCRIPTION

Figure 1:
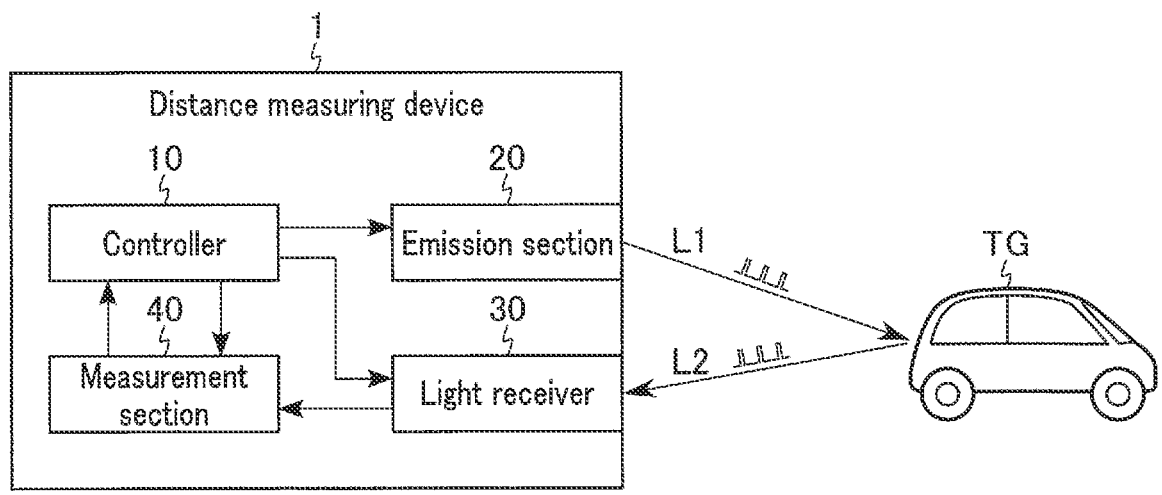
FIG. 1 depicts a schematic diagram showing an example of an overall configuration of a distance measuring device according to a first embodiment.

In general, according to one embodiment, a light detector includes a substrate, a plurality of avalanche photodiodes, a well region, and a microlens array. The plurality of avalanche photodiodes are provided above the substrate. Each of the avalanche photodiodes is surrounded by a trench portion among a plurality of trench portions. The well region is provided between the trench portions that are adjacent to each other. The well region includes at least one of a transistor and a diode. The microlens array is provided to cover the avalanche photodiodes.

Hereinafter, embodiments will be described with reference to the drawings. Each embodiment exemplifies a device and a method for embodying a technical idea of the invention. The drawings are schematic or conceptual, and the dimensions and ratios, etc. in the drawings are not always the same as those of the actual products. In the drawings to be referred to below, an "X direction", a "Y direction", and a "Z direction" correspond to directions intersecting one another. The technical idea of the present invention is not specified by the shapes, structures, arrangements, etc. of the structural elements.

In the following descriptions, structural elements having substantially the same function and configuration will be denoted by the same reference symbol. The numbers after the letters that make up the reference signs are used to distinguish between elements referenced by reference signs containing the same letters and that have a similar configuration. When there is no need to distinguish components denoted by reference signs containing the same letters from each other, such components may be referred to by a reference sign containing the letters only.

[1] First Embodiment

A distance measuring device 1 according to a first embodiment is, for example, a type of LiDAR (Light Detection and Ranging) capable of measuring a distance between the distance measuring device 1 and a target object TG. The distance measuring device 1 according to the first embodiment will be described below.

[1-1] Configuration of Distance Measuring Device 1
[1-1-1] Overall Configuration of Distance Measuring Device 1

FIG. 1 depicts a schematic diagram showing an example of an overall configuration of the distance measuring device 1 according to the first embodiment. As shown in FIG. 1, in this example, a vehicle is located in front of the distance measuring device 1 as a ranging target object TG. Then, the distance measuring device 1 according to the first embodiment includes a controller 10, an emission section 20, a light receiver 30, and a measurement section 40.

The controller 10 controls an overall operation of the distance measuring device 1. The controller 10 includes, for example, a CPU (Central Processing Unit), a ROM (Read Only Memory), a RAM (Random Access Memory), and an oscillator, all of which are not shown. The ROM stores a program used for an operation of the distance measuring device 1, etc. The CPU controls the emission section 20, light receiver 30, and measurement section 40 according to the program stored in the ROM. The RAM is used as a working area of the CPU. The oscillator is used for generating an intermittent pulse signal. The controller 10 is also capable of executing various data processing and arithmetic processing.

The emission section 20 intermittently generates and emits laser light. The generated and emitted laser light is applied to the target object TG, and used for measuring a distance between the distance measuring device 1 and the target object TG. In the present specification, the laser light emitted from the emission section 20 is referred to as "outgoing light L1". The outgoing light L1 reflected by the target object TG is referred to as "reflected light L2". The emission section 20 may be referred to as a light emitter.

The light receiver 30 detects light incident on the distance measuring device 1, and transfers a light reception result to the measurement section 40. In other words, the light receiver 30 converts the light incident on the distance measuring device 1 into an electric signal, and transfers the converted electric signal to the measurement section 40. The light receiver 30 is used for detecting the reflected light L2 intermittently incident on the distance measuring device 1.

The measurement section 40 measures a time at which the light receiver 30 detects the reflected light L2 based on the light reception result transferred from the light receiver 30. Then, the measurement section 40 measures the distance between the distance measuring device 1 and the target object TG based on a time at which the outgoing light L1 is emitted from the emission section 20 and the time at which the light receiver 30 detects the reflected light L2. The time at which the outgoing light L1 is emitted from the emission section 20 is, for example, reported from the controller 10.

Figure 2:
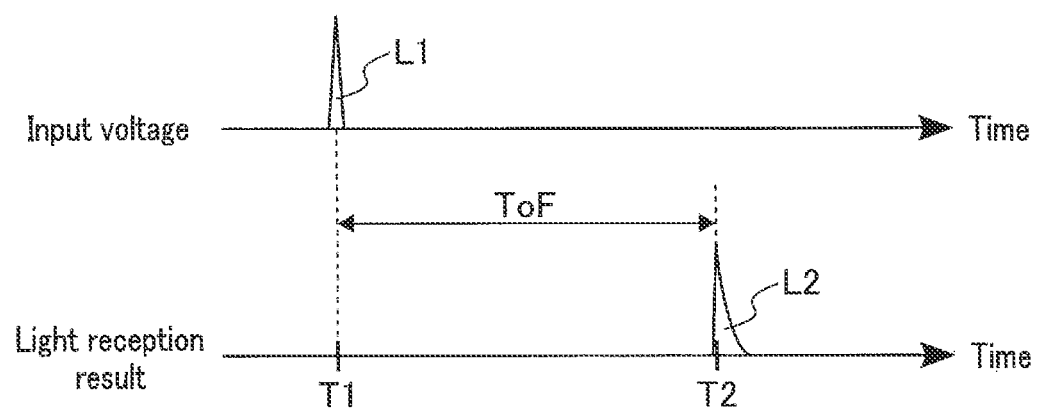
FIG. 2 depicts a schematic diagram that outlines a ranging method of the distance measuring device according to the first embodiment.

FIG. 2 depicts a schematic diagram that outlines a ranging method of the distance measuring device 1 according to the first embodiment. The waveform of an input voltage indicates a temporal change in voltage to be supplied to the light source included in the emission section 20. The waveform of a light reception result indicates a temporal change in strength of an electric signal based on light detected by the light receiver 30. As shown in FIG. 2, when a pulse signal is supplied to the light source of the emission section 20, the outgoing light L1 is generated and emitted based on a rise of the pulse signal. Then, said outgoing light L1 is applied to the target object TG, and the light receiver 30 detects the reflected light L2 reflected from the target object TG.

The measurement section 40 calculates a time of flight (ToF) of the outgoing light L1 based on a difference between an emission time T1 at which the outgoing light L1 is emitted from the emission section 20 and a light-receiving time T2 at which the light receiver 30 detects the reflected light L2. Then, the measurement section 40 measures (ranges) the distance between the distance measuring device 1 and the target object TG based on the time of flight of the outgoing light L1 and the velocity of the laser light. Such a ranging method of the distance measuring device 1 may be called a "ToF method". The measurement section 40 outputs a ranging result for each set of the outgoing light L1 and the reflected light L2 that the distance measuring device 1 emits and receives.

The measurement section 40 may decide the emission time T1 based at least on a time relating to emission of the outgoing light L1, and decide the light-receiving time T2 based on a time relating to light reception of the reflected light L2. For example, the measurement section 40 may decide the emission time T1 and the light-receiving time T2 based on a rise time of a signal or based on a peak time of a signal. The controller 10 may be provided for each of the emission section 20, the light receiver 30, and the measurement section 40. Processing of the measurement section 40 may be performed by the controller 10. The distance measuring device 1 may include an image processor that generates an image based on a ranging result of the measurement section 40. Such an image is referred to by a control program of a vehicle, etc. equipped with the distance measuring device 1.

[1-1-2] Configuration of Emission Section 20

Figure 3:
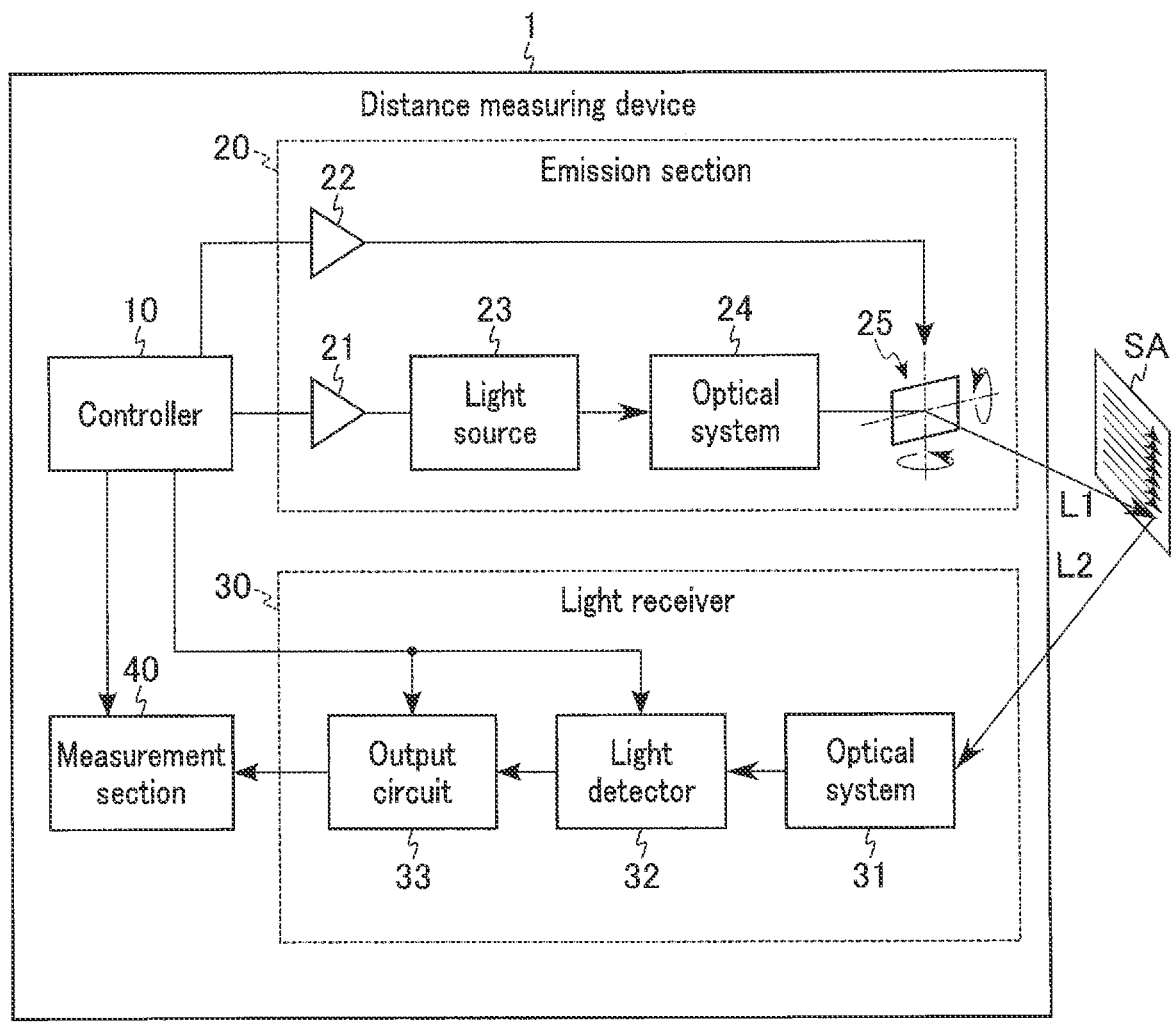
FIG. 3 depicts a schematic diagram showing an example of configurations of an emission section and a light receiver included in the distance measuring device according to the first embodiment.

FIG. 3 depicts a schematic diagram showing an example of configurations of the emission section 20 and the light receiver 30 included in the distance measuring device 1 according to the first embodiment. As shown in FIG. 3, the emission section 20 in the first embodiment includes drivers 21 and 22, a light source 23, an optical system 24, and a mirror 25.

The driver 21 generates a drive current according to a pulse signal input from the oscillator of the controller 10. Then, the driver 21 supplies the generated drive current to the light source 23. That is, the driver 21 functions as a current supply source of the light source 23.

The driver 22 generates a drive current according to control performed by the controller 10. Then, the driver 22 supplies the generated drive current to the mirror 25. That is, the driver 22 functions as a power supply circuit of the mirror 25.

The light source 23 is a laser light source, such as a laser diode. The light source 23 intermittently emits laser light (outgoing light L1) based on the intermittent drive current (pulse signal) supplied from the driver 21. The laser light emitted by the light source 23 is incident on the optical system 24.

The optical system 24 can include a plurality of lenses and optical elements. The optical system 24 is arranged on an optical path of the outgoing light L1 emitted by the light source 23. For example, the optical system 24 collimates the incident outgoing light L1, and guides the collimated outgoing light L1 to the mirror 25. The optical system 24 may include a beam shaper, a beam splitter, etc.

The mirror 25 is driven based on the drive current supplied from the driver 22, and reflects the outgoing light L1 incident on the mirror 25. For example, a reflecting surface of the mirror 25 is formed to be rotatable or swinging around two axes intersecting each other. The outgoing light L1 reflected by the mirror 25 is applied to the target object TG outside the distance measuring device 1.

In the distance measuring device 1 according to the first embodiment, the controller 10 changes an emitting direction of the outgoing light L1 by controlling the mirror 25 so as to scan an area to be ranged. The emission section 20 may have a configuration capable of performing scanning using laser light, or may have other configurations. For example, the emission section 20 may further include an optical system arranged on an optical path of laser light reflected by the mirror 25.

In the present specification, an area that is ranged by the distance measuring device 1 is referred to as a "scanning area SA". The distance measuring device 1 performs a measurement operation of a plurality of points within the scanning area SA to measure distances from various target objects TG. In addition, a set of ranging results of a plurality of points corresponding to single scanning is referred to as a "frame". The distance measuring device 1 performs scanning continuously so that it can sequentially acquire a distance from a target object TG in front of itself.

Figure 4:
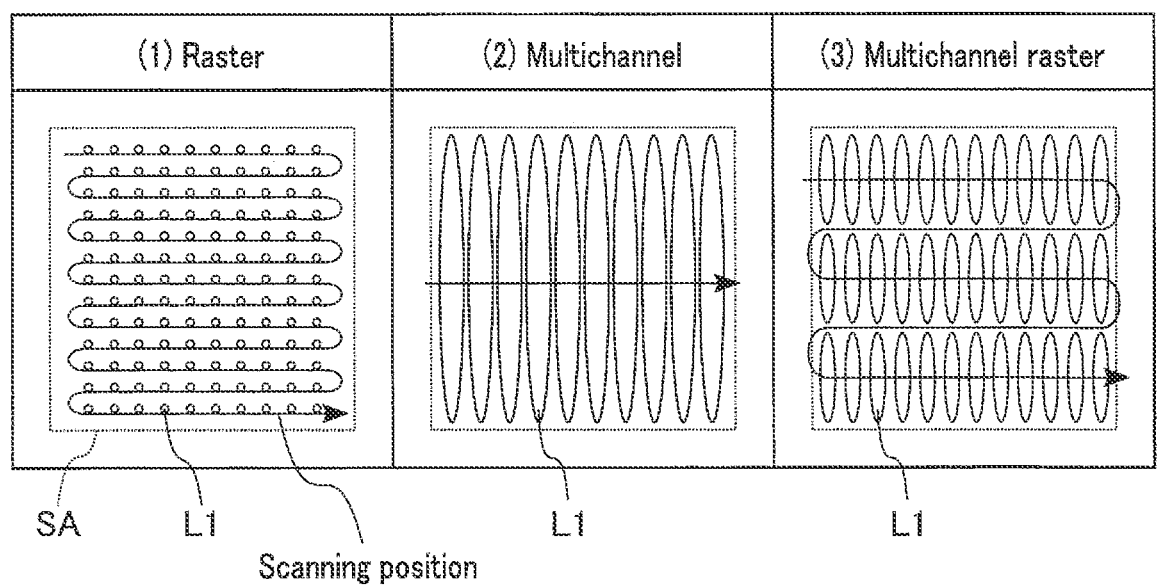
FIG. 4 depicts a table showing an example of a scanning method of the emission section in the distance measuring device according to the first embodiment.

FIG. 4 depicts a table showing an example of a scanning method performed by the distance measuring device 1 according to the first embodiment. The table shown in FIG. 4 indicates three types of combinations of a name and a specific example of a scanning method. In FIG. 4, reference sign "L1" indicates the shape and the emission timing of the outgoing light L1 in the associated scanning method. The arrow "scanning position" schematically indicates a path in which a plurality of beams of outgoing light L1 are emitted in sequence, within the scanning area SA. "Leftward direction" and "rightward direction" refer to the leftward direction and the rightward direction on the drawing sheet, respectively.

In the scanning method shown in FIG. 4 (1), for example, the outgoing light L1 having a dot-shaped irradiation surface is used. Then, the distance measuring device 1 performs scanning in the rightward and leftward directions repeatedly. Specifically, the distance measuring device 1 scans in the rightward direction and then turns back to scan in the leftward direction, and after scanning in the rightward direction again, turns back again to scan in the leftward direction. Such a scanning method is referred to as "raster scanning". As a means for realizing the raster scanning, it is conceivable to use, for example, a biaxial mirror as the mirror 25. Note that it turns back to scan in the leftward direction in this example, but turning back may be omitted to perform only rightward scanning.

In the scanning method shown in FIG. 4 (2), the outgoing light L1 having an irradiation surface elongated in the longitudinal direction is used. In this case, the emission section 20 includes, for example, a collimator lens and a cylindrical lens. Then, the distance measuring device 1 irradiates a plurality of pixels PX in a longitudinal line at the same time, and scans in the rightward direction. Such a scanning method is referred to as "multichannel scanning". As a means for realizing the multichannel scanning, it is conceivable to use a polygon mirror, a revolving mirror, or a single-axis MEMS mirror, as the mirror 25. The multichannel scanning may be realized by rotating the distance measuring device 1 itself without using the mirror 25. The multichannel scanning can irradiate a plurality of pixels PX at the same time in a single laser emission. Thus, use of the multichannel scanning enables higher resolution and/or a higher frame rate than the raster scanning.

In the scanning method shown in FIG. 4 (3), the outgoing light L1 having an irradiation surface elongated in the longitudinal direction is used. In this case, the emission section 20 includes, for example, an anisotropic aspherical collimator lens. Then, the distance measuring device 1 irradiates a plurality of pixels in a longitudinal line at the same time and scans in the rightward direction, and then repeatedly performs scanning shifted in the perpendicular direction. Such a scanning method is referred to as "multichannel raster scanning". As a means for realizing the multichannel raster scanning, it is conceivable to use a polygon mirror having different tilt angles, a revolving mirror, a biaxial mirror, etc., as the mirror 25. Such multichannel raster scanning can also irradiate a plurality of pixels PX at the same time in a single laser emission, and thus can enable higher resolution and/or a higher frame rate than the raster scanning. Conversely, in order to obtain a certain degree of high resolution and high frame rate, it is preferable that the raster scanning or the multichannel raster scanning is used.

The above-described scanning methods are only examples. The scanning methods shown in FIG. 4 (1) to (3) correspond to mechanical methods. The distance measuring device 1 may use an OPA (Optical Phased Array) method as another scanning method. The number of straight-line paths and the scanning direction in single scanning may be other settings. The operation and effect provided by the distance measuring device 1 according to the first embodiment do not depend on the scanning method of the outgoing light L1. Thus, the distance measuring device 1 according to the first embodiment may perform scanning by using any one of the mechanical methods and the OPA method. In the following, a case where the distance measuring device 1 uses the multichannel raster scanning will be described.

[1-1-3] Configuration of Light Receiver 30

A configuration of the light receiver 30 included in the distance measuring device 1 according to the first embodiment will be described with reference to FIG. 3 again. As shown in FIG. 3, the light receiver 30 includes, for example, an optical system 31, a light detector 32, and an output circuit 33.

The optical system 31 can include at least one lens. The optical system 31 collects the reflected light L2 incident on the distance measuring device 1 in the light detector 32.

The light detector 32 converts light incident on said light detector 32 via the optical system 31 into an electric signal. The light detector 32 includes, for example, a photomultiplier element using a semiconductor. As the photomultiplier element, for example, a single-photon avalanche diode (SPAD), which is a type of avalanche photodiode, is used. The electric signal (light reception result) converted by the light detector 32 is transferred to the output circuit 33.

The output circuit 33 converts the electric signal transferred from the light detector 32 into a digital signal, and outputs the digital signal corresponding to a light reception result to the measurement section 40.

In the distance measuring device 1 according to the first embodiment, an optical axis of the light detector 32 of the light receiver 30 is different from that of the light source 23 of the emission section 20. That is, the distance measuring device 1 includes a non-coaxial optical system between the emission section 20 and the light receiver 30. The light receiver 30 may have other configurations, e.g., a coaxial optical system or a separation optical system, as long as it can detect the reflected light L2 incident on the distance measuring device 1.

Figure 5:
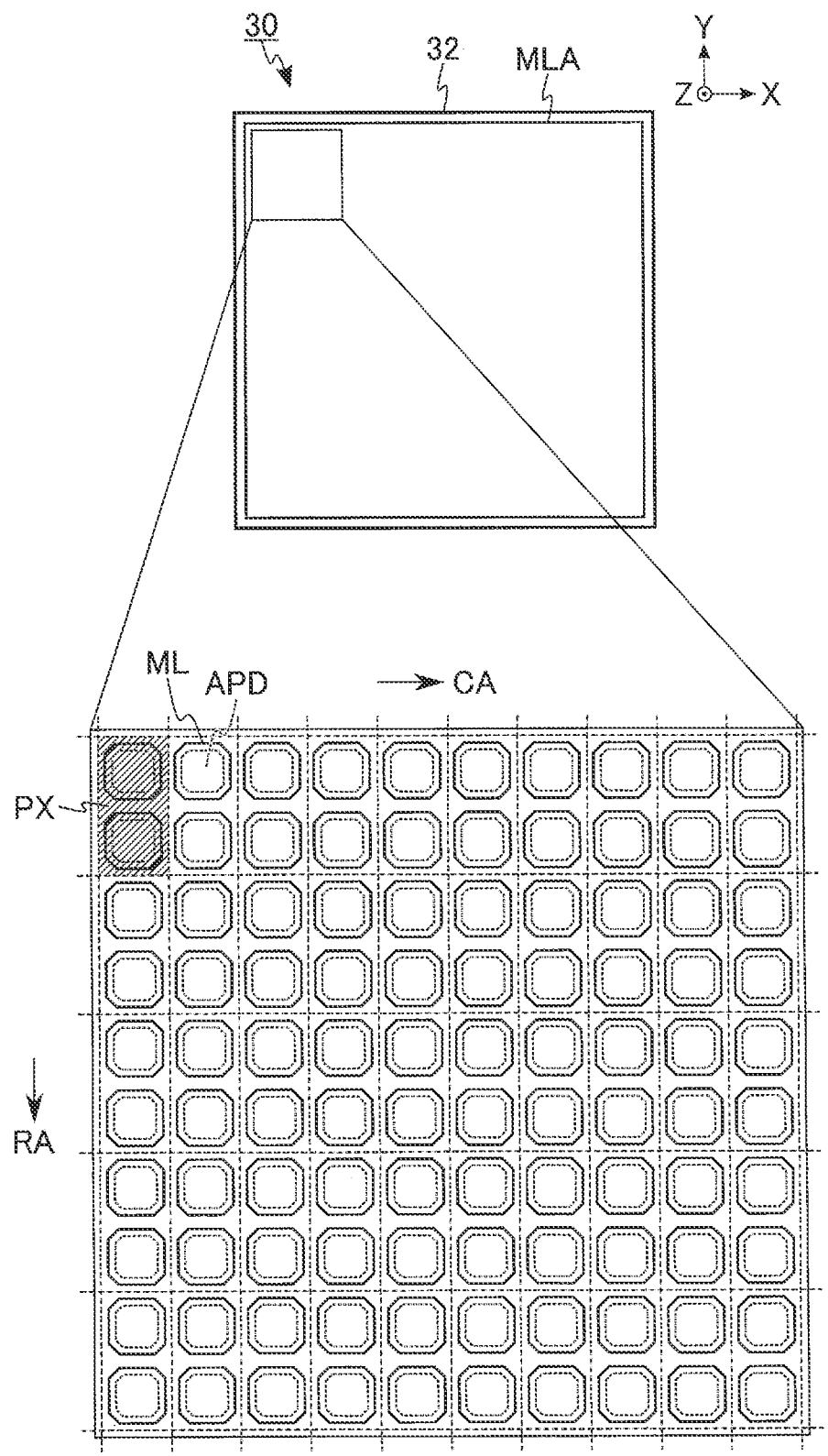
FIG. 5 depicts a plan view showing an example of a planar layout of the light receiver included in the distance measuring device according to the first embodiment.

FIG. 5 depicts a plan view showing an example of a planar layout of the light receiver 30 included in the distance measuring device 1 according to the first embodiment, showing an enlarged part of the light detector 32. As shown in FIG. 5, the light detector 32 includes, for example, a rectangular light-receiving surface. Then, the light receiver 30 further includes a microlens array MLA provided so as to overlap the light detector 32.

The microlens array MLA is, for example, included in the optical system 31. The microlens array MLA includes a plurality of microlenses ML. The microlenses ML are, for example, arranged in a matrix. The microlenses ML respectively overlap a plurality of avalanche photodiodes APD. Further, the microlens ML is formed so that light transmitted through itself is incident on the associated avalanche photodiode APD.

The avalanche photodiode APD can be set to an active state or an inactive state by the controller 10. The avalanche photodiode APD in the active state detects light incident on said avalanche photodiode APD, and outputs an optical signal indicating a detection result to the output circuit 33. The avalanche photodiode APD in the inactive state is in a power-saving state, and cannot detect light. In the light detector 32 according to the first embodiment, two avalanche photodiodes APD adjacent to each other in the Y direction constitute one pixel PX. In FIG. 5, a dashed grid added to the enlarged portion of the light receiver 30 illustrates a region of each pixel PX.

The pixel PX is used as the smallest unit of the region in which the light detector 32 can detect light. The number of avalanche photodiodes APD constituting the pixel PX may be at least one or more. A pixel PX containing a plurality of avalanche photodiodes APD is also referred to as a silicon photomultiplier (SiPM). A dynamic range of light that can be detected by the light detector 32 can vary depending on the number of avalanche photodiodes APD contained in one pixel PX. To each pixel PX, for example, a set of a column address CA and a row address RA is assigned. That is, each pixel PX can be specified by a set of a column address CA and a row address RA. In the present specification, for the sake of simplicity, a case will be described where the column address CA and the row address RA are assigned with the upper left of the microlens array MLA as the origin.

[1-1-4] Configuration of Measurement Section 40

FIG. 6 depicts a schematic diagram showing an example of a configuration of the measurement section 40 included in the distance measuring device 1 according to the first embodiment. As shown in FIG. 3, the measurement section 40 includes, for example, an amplifier (e.g., a Trans Impedance Amplifier (TIA)), an analog-to-digital converter ADC, and an averaging circuit SAT.

The number of each of TIA and ADC is equal to that of outputs of the light detector 32, i.e., outputs of selected pixels PX. Specifically, the output of the selected pixel PX is input to the SAT via the TIA and the ADC. The SAT outputs a result (distance value, peak luminance, etc.) of averaging (time division accumulation) a signal of the selected pixel PX and signals from surrounding pixels PX. Unlike other averaging circuits, the SAT outputs a result for each pixel PX. Thus, the SAT can suppress a decrease in resolution.

Specifically, the SAT includes at least one luminance buffer LB for each output of the light detector 32. In the present example, the SAT includes a luminance buffer LB (n) holding a luminance value of the nth outgoing light L1 and a luminance buffer Lb (n−1) holding a luminance value of the (n−1)th outgoing light L1 for each output of the light detector 32. Outputs of the luminance buffers LB (n) and LB (n−1) included in the SAT are input to a calculation part of the SAT.

The calculation part can execute time division accumulation processing using an accumulation gate, detection of a peak portion (peak), interpolation processing, etc. In the SAT, an ADC sampling result of the previous measurement (in the case of multichannel raster scanning, for example, a measurement result of pixels PX on the left side), that is, a time-series signal of luminance, is held by the luminance buffer LB (n−1). In addition, in the SAT, a similarity of peripheral pixels PX is determined, and similar time-series signals are extracted and accumulated. As a criterion for determining the similarity of the pixels PX, for example, both similarity of bottom portion (floor) values and similarity of peak portion (peak) values of respective time-series signals are used.

As a result, the SAT can determine similarity/identity of a target object with high accuracy, exclude signals from different target objects, i.e., noise, and increase an S/N ratio (signal-to-noise ratio) of the signal. Further, the SAT can effectively increase a dynamic range of a pixel PX. The pixel PX described below can achieve a high resolution. On the other hand, the pixel PX tends to have a low dynamic range. Therefore, the distance measuring device 1 according to the first embodiment alleviates the dynamic range problem while maintaining the high resolution by using the SAT.

[1-2] Configuration of Light Detector 32

Figure 7:
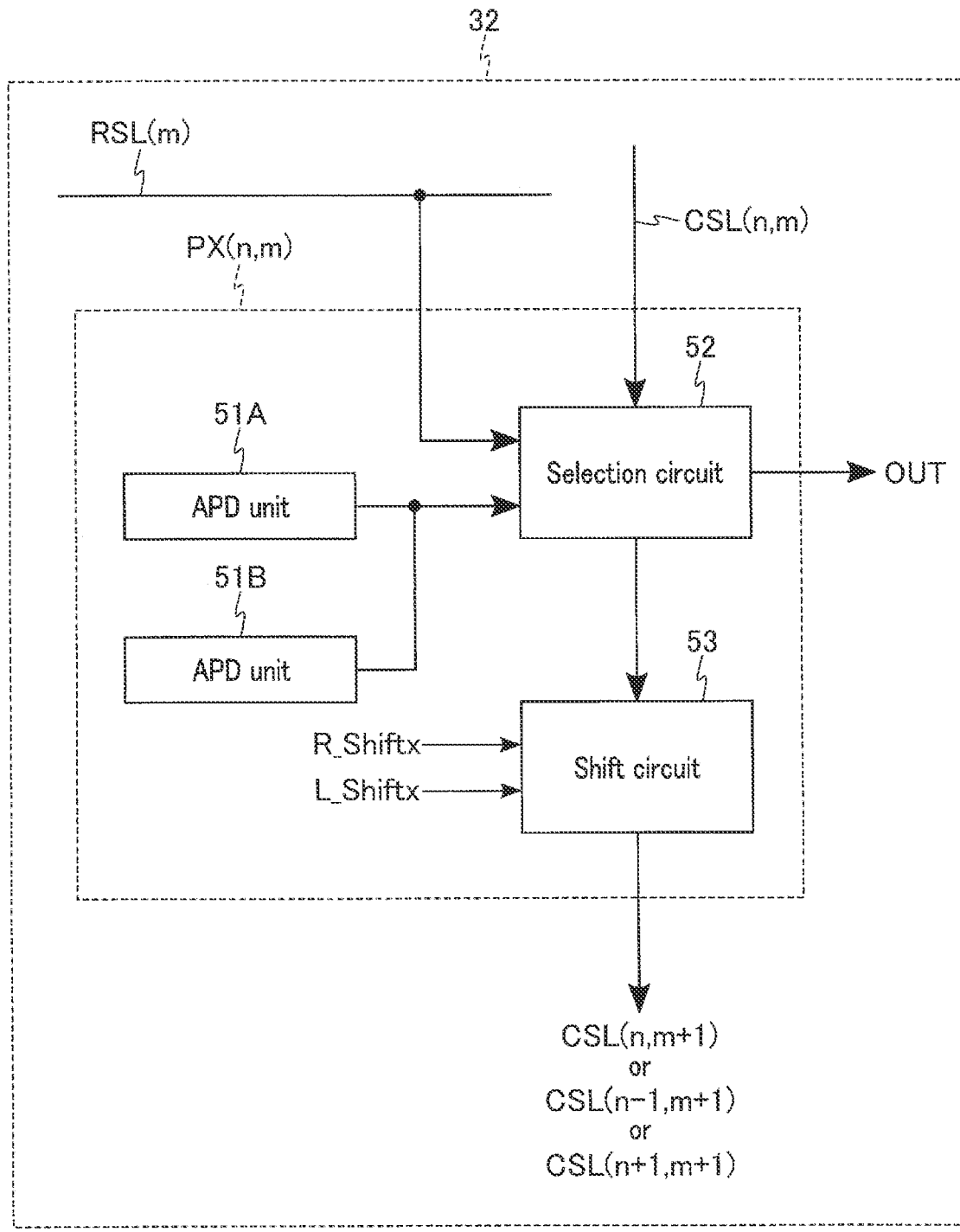
FIG. 7 depicts a block diagram showing an example of a configuration of a light detector according to the first embodiment.

FIG. 7 depicts a block diagram showing an example of a configuration of the light detector 32 according to the first embodiment, showing a structural element associated with one pixel PX. As shown in FIG. 7, the light detector 32 includes a column selection line CSL (n, m), a row selection line RSL (m), and a pixel PX (n, m). The "n" and "m" represent a column address CA and a row address RA, respectively. Each of the "n" and "m" is an integer of 1 or more. One pixel PX can be specified by a set of a column address CA and a row address RA.

The column selection line CSL (n, m) is an interconnect coupled to the pixel PX (n, m) and is for transferring a column selection signal to the pixel PX (n, m). In the light detector 32, the column selection line CSL is provided, for example, for each pixel PX.

The row selection line RSL (m) is an interconnect coupled to a plurality of pixels PX sharing the same row address RA and is for transferring a row selection signal to said pixels PX. The light detector 32 includes, for example, a plurality of row selection lines RSL corresponding to the number of pixels PX arranged in the Y direction.

Each pixel PX includes, for example, two APD units 51A and 51B, a selection circuit 52, and a shift circuit 53. Each of the APD units 51A and 51B is a circuit including an avalanche photodiode APD usable for detecting light. An output of each of the APD units 51A and 51B is input to the selection circuit 52.

The selection circuit 52 is coupled to the column selection line CSL (n, m) and the row selection line RSL (m). The selection circuit 52 sets the pixel PX (n, m) to an active state or an inactive state based on the input column selection signal and row selection signal. The pixel PX in the active state outputs a light reception result to the measurement section 40 via the selection circuit 52 ("OUT"). The pixel PX in the inactive state does not output a light reception result to the measurement section 40. While the selection circuit 52 and the APD unit 51 are separated in this example, a part of the selection circuit may be included in the APD unit 51.

The shift circuit 53 transfers a column selection signal input to the pixel PX (n, m) to a column selection line CSL (n, m+1) coupled to a pixel PX (n, m+1), a column selection line CSL (n−1, m+1) coupled to a pixel PX (n−1, m+1), or a column selection line CSL (n+1, m+1) coupled to a pixel PX (n+1, m+1) based on control signals R_Shiftx and L_Shiftx.

Each of the control signals R_Shiftx and L_Shiftx is generated by the controller 10, and input to the shift circuit 53. The control signal R_Shiftx is a signal for shifting a part of the active area of the light detector 32 to the right side (the positive side of the X coordinate). The control signal L_Shiftx is a signal for shifting a part of the active area of the light detector 32 to the left side (the negative side of the X coordinate). The active area is an area used for detecting the reflected light L2 in the light detector 32 and composed of at least one pixel PX. An example of setting of an active area will be described later. In this example, the shift circuit is applied to the column selection line CSL, but a shift function by the shift circuit may be applied to the row selection line RSL. Further, since the light detector 32 includes two shift circuits, the shift function by the shift circuit may be applied to both the column selection line CSL and the row selection line RSL.

[1-2-1] Circuit Configuration of Pixel PX

A circuit configuration of a pixel PX in the first embodiment will be described below.

(Circuit Configurations of APD Units 51A and 51B and Selection Circuit 52)

Figure 8:
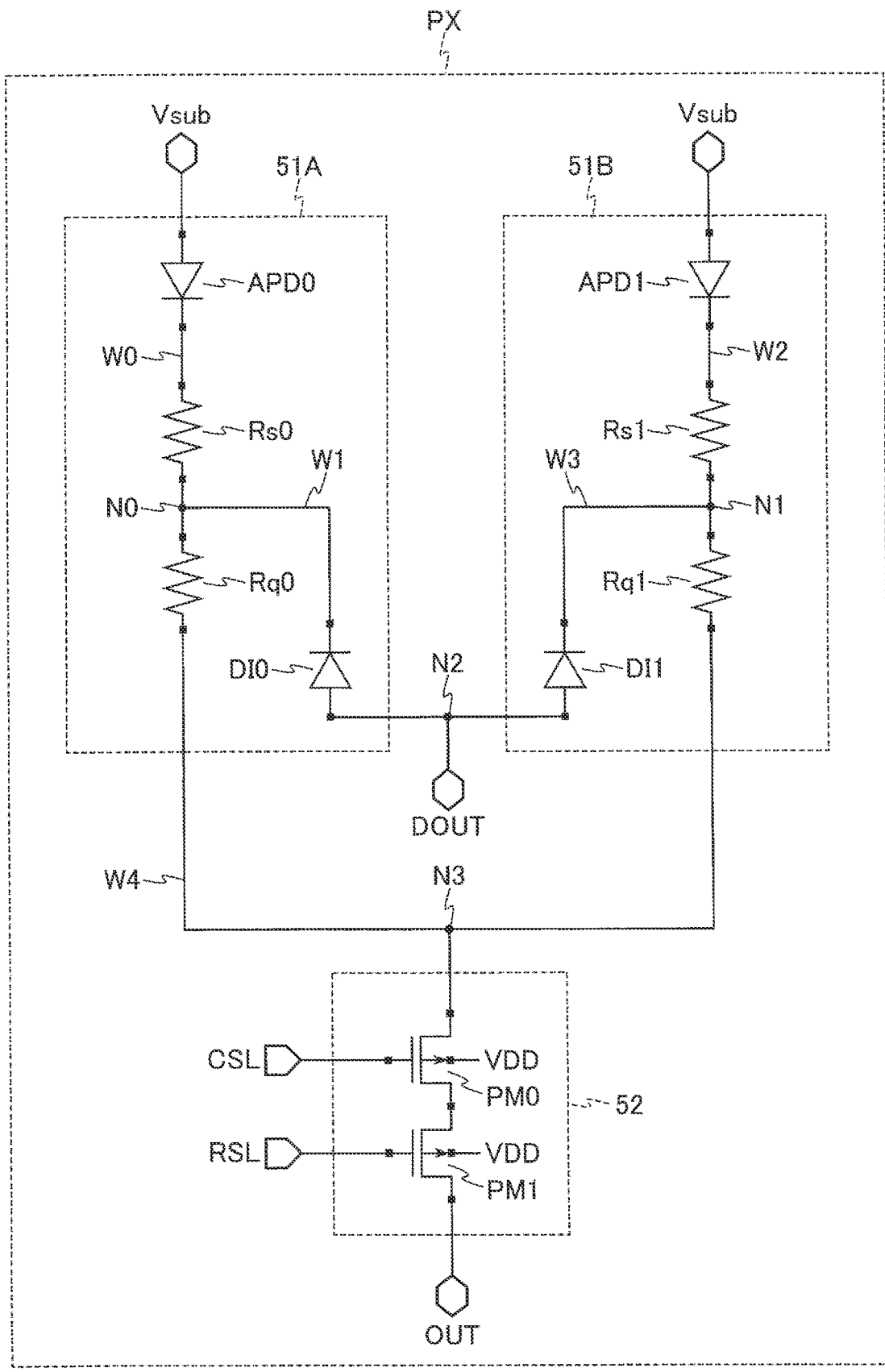
FIG. 8 depicts a circuit diagram showing an example of circuit configurations of an APD unit and a selection circuit included in a pixel included in the light detector according to the first embodiment.

FIG. 8 depicts a circuit diagram showing an example of circuit configurations of APD units 51A and 51B and a selection circuit 52 included in a pixel PX included in the light detector 32 according to the first embodiment. As shown in FIG. 8, the APD unit 51A includes an avalanche photodiode APD0, a protection resistor Rs0, a diode DI0, and a quench resistor Rq0. The APD unit 51B includes an avalanche photodiode APD1, a protection resistor Rs1, a diode DI1, and a quench resistor Rq1. The selection circuit 52 includes P-type transistors PM0 and PM1. In addition, the pixel PX includes nodes N0 to N3 and interconnects W0 to W4.

The anode of the avalanche photodiode APD0 is coupled to a node to which a substrate voltage Vsub is applied. The cathode of the avalanche photodiode APD0 is coupled to one end of the protection resistor Rs0. The other end of the protection resistor Rs0 is coupled to the node N0. The diode DI0 is a rectifier diode. The cathode of the diode DI0 is coupled to the node N0. The anode of the diode DI0 is coupled to the node N2. One end of the quench resistor Rq0 is coupled to the node N0. The other end of the quench resistor Rq0 is coupled to the node N3.

The anode of the avalanche photodiode APD1 is coupled to a node to which a substrate voltage Vsub is applied. The cathode of the avalanche photodiode APD1 is coupled to one end of the protection resistor Rs1. The other end of the protection resistor Rs1 is coupled to the node N1. The diode DI1 is a rectifier diode. The cathode of the diode DI1 is coupled to the node N1. The anode of the diode DI1 is coupled to the node N2. One end of the quench resistor Rq1 is coupled to the node N1. The other end of the quench resistor Rq1 is coupled to the node N3.

The node N2 is coupled to a constant voltage node DOUT. A voltage applied to the constant voltage node DOUT is usually set to be lower than each of a sum of a voltage at which an electronic avalanche stops at the avalanche photodiode APD0 and a threshold voltage Vth of the diode DI0 and a sum of a voltage at which an electronic avalanche stops at the avalanche photodiode APD1 and a threshold voltage Vth of the diode DI1.

The source of the P-type transistor PM0 is coupled to the node N3. The body of the P-type transistor PM0 is coupled to a power supply node VDD. A column selection line CSL is coupled to the gate of the P-type transistor PM0, and a column selection signal is input thereto. The source of the P-type transistor PM1 is coupled to the drain of the P-type transistor PM0. The body of the P-type transistor PM1 is coupled to the power supply node VDD. A row selection line RSL is coupled to the gate of the P-type transistor PM1, and a row selection signal is input thereto. The drain of the P-type transistor PM1 is coupled to an output node OUT of the pixel PX. That is, the pixel PX in an active state outputs an output signal corresponding to a light reception result of the avalanche photodiode APD from the drain of the P-type transistor PM1. Note that the coupling order of the P-type transistors PM0 and PM1 may be reversed. In this case, the pixel PX in the active state outputs an output signal from the drain of the P-type transistor PM0.

The interconnect W0 corresponds to an interconnect coupling the avalanche photodiode APD0 and the protection resistor Rs0. The interconnect W1 corresponds to an interconnect coupling the node N0 and the diode DI0. The interconnect W2 corresponds to an interconnect coupling the avalanche photodiode APD1 and the protection resistor Rs1. The interconnect W3 corresponds to an interconnect coupling the node N1 and the diode DI1. The interconnect W4 corresponds to an interconnect coupled to the node N3.

Note that the pixel PX may further include an N-type transistor coupled to the node N3, and carriers accumulated in the node N3 in an inactive state may be discharged via said N-type transistor. For example, two N-type transistors are coupled to the node N3 in parallel, and the other ends of said two N-type transistors are coupled to a power line VSS with low electric potential. Then, the column selection line CSL and the row selection line RSL are respectively coupled to the gates of said two N-type transistors. When inactive, the voltage of either the column selection line CSL or the row selection line RSL becomes an "H" level, and any one of the two N-type transistors coupled in parallel is turned on. As a result, carriers unnecessarily accumulated in the node N3 can be discharged to the power line VSS as compared with a case where the two N-type transistors are not coupled to the node N3.

In addition, the quench resistor Rq0 may be an active element such as a transistor. FIG. 9 depicts a circuit diagram showing an example of circuit configurations of a selection circuit 52 and an APD unit 51 in a modification of the first embodiment. As shown in FIG. 9, the selection circuit 52 and the APD unit 51 in the modification of the first embodiment include, for example, power lines 100 and 110, P-type transistors 120 and 121, N-type transistors 130 and 131, inverters 140, 141, 142, 143, and 144, a NAND circuit 150, and nodes N11, N12, and N13.

A power voltage Vdd is applied to the power line 100. The power line 110 is grounded (ground voltage Vss). The source of the P-type transistor 120 is coupled to the power line 100. The drain of the P-type transistor 120 is coupled to the node N11. The gate of the P-type transistor 120 is coupled to the node N12. The source of the P-type transistor 121 is coupled to the power line 100. The drain of the P-type transistor 121 is coupled to the node N12. The gate of the P-type transistor 121 is coupled to the node N13. The drain of the N-type transistor 130 is coupled to the node N11. The source of the N-type transistor 130 is coupled to the power line 110. The drain of the N-type transistor 131 is coupled to the node N12. The source of the N-type transistor 131 is coupled to the power line 110. The gate of the N-type transistor 131 is coupled to the node N11.

The input end of the inverter 140 is coupled to the node N11. The output end of the inverter 140 is coupled to the input end of the inverter 141, and corresponds to an output node OUT. The output end of the inverter 142 is coupled to the input end of the inverter 143. The output end of the inverter 143 is coupled to a first input end of the NAND circuit 150. A second input end of the NAND circuit 150 is coupled to a column selection line CSL. A third input end of the NAND circuit 150 is coupled to a row selection line RSL. The output end of the NAND circuit 150 is coupled to each of the input end of the inverter 144 and the gate of the P-type transistor 121. The output end of the inverter 144 is coupled to the gate of the N-type transistor 130. The anode of the avalanche photodiode APD is coupled to the node N12. A substrate voltage Vsub is applied to the cathode of the avalanche photodiode APD.

A method of quenching by the selection circuit 52 and the APD unit 51 in the modification of the first embodiment is called active quenching. In the circuit shown in FIG. 9, a pulse is output from the output node OUT when each of the column selection line CSL and the row selection line RSL is selected. If each of the column selection line CSL and the row selection line RSL is not selected, there is no output from the output node OUT. When avalanche breakdown occurs in the avalanche photodiode APD when each of the column selection line CSL and the row selection line RSL is selected, a voltage (Vcathode) of the node N12 drops and a voltage (Midpoint) of the node N11 becomes high. Then, the N-type transistor 131 is turned on, the voltage of the node N12 becomes low, and quenching occurs. After that, with a certain delay, a voltage (Pdrive) of the node N13 becomes an "L" level, and the P-type transistor 121 is turned on. In addition, the voltage of the node N11 also drops and tries to quickly return to the original state.

The selection circuit 52 and the APD unit 51 in the modification of the first embodiment can make a recovery time shorter than the circuit of FIG. 8 in which a time constant is determined by a junction capacitance between the quench resistor Rq0 and the avalanche photodiode APD. That is, the selection circuit 52 and the APD unit 51 in the modification of the first embodiment can detect the next photon faster than the circuit of FIG. 8, and thus increase the dynamic range of the light detector 32.

(Circuit Configuration of Shift Circuit 53)

Figure 10:
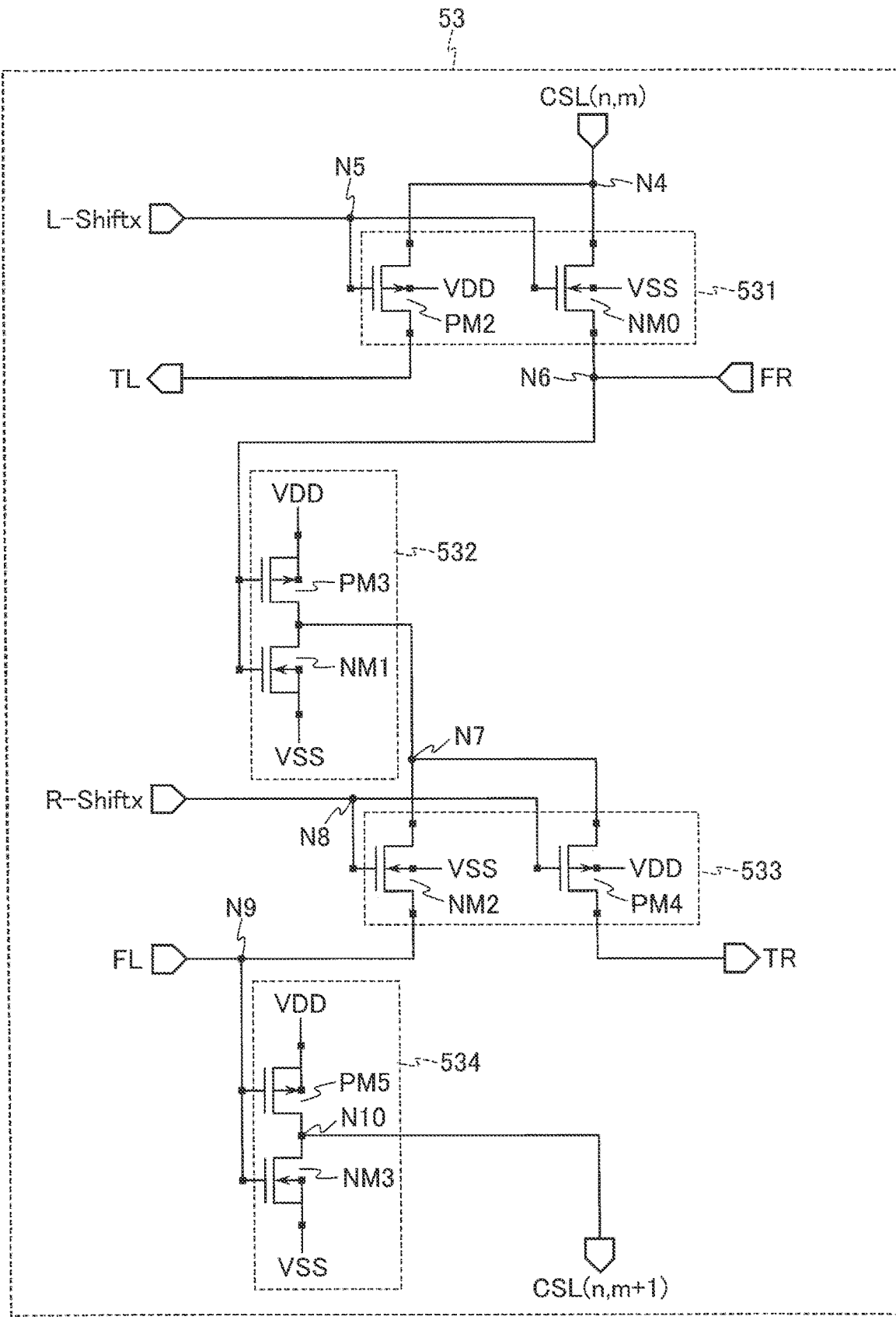
FIG. 10 depicts a circuit diagram showing an example of a circuit configuration of a shift circuit included in the pixel included in the light detector according to the first embodiment.

FIG. 10 depicts a circuit diagram showing an example of a circuit configuration of a shift circuit 53 included in a pixel PX included in the light detector 32 according to the first embodiment, focusing on a shift circuit 53 associated with a column selection line CSL (n, m). As shown in FIG. 10, the shift circuit 53 includes a first shift circuit 531, an inverter 532, a second shift circuit 533, and an inverter 534. Further, the shift circuit 53 includes input terminals FR (From Right) and FL (From Left), output terminals TR (To Right) and TL (To Left), and nodes N4 to N10.

The first shift circuit 531 includes a P-type transistor PM2 and an N-type transistor NM0. The source of the P-type transistor PM2 is coupled to the node N4. The drain of the P-type transistor PM2 is coupled to an output terminal TL. An output terminal TL of a shift circuit 53 of a pixel PX (n, m) is coupled to an input terminal FR of a shift circuit 53 of a pixel PX (n−1, m). The body of the P-type transistor PM2 is coupled to a power supply node VDD. The gate of the P-type transistor PM2 is coupled to the node N5. The drain of the N-type transistor NM0 is coupled to the node N4. The source of the N-type transistor NM0 is coupled to the node N6. The body of the N-type transistor NM0 is coupled to a ground node VSS. The gate of the N-type transistor NM0 is coupled to the node N5.

A control signal L-Shiftx is input to the node N5. The control signal L-Shiftx is, for example, generated by a logic circuit in the controller 10 and the light detector 32. The first shift circuit 531 transfers a column selection signal input to the pixel PX (n, m) to the input terminal FR of the shift circuit 53 of the pixel PX (n−1, m) via the output terminal TL when the control signal L-Shiftx is at the "L" level. On the other hand, the first shift circuit 531 transfers a column selection signal input to the pixel PX (n, m) to the node N6 when the control signal L-Shiftx is at the "H" level. That is, the first shift circuit 531 transfers the column control signal to the pixel PX (n−1, m) based on the control of the control signal L-Shiftx by the logic circuit in the controller 10 and the light detector 32.

The input terminal FR is coupled to the node N6. That is, a column selection signal output via an output terminal TL of a shift circuit 53 of a pixel PX (n+1, m) can be input to the node N6 of the shift circuit 53 of the pixel PX (n, m). Specifically, when the control signal L-Shiftx is at the "L" level, the column selection signal input to the pixel PX (n+1, m) is input to the node N6 of the shift circuit 53 of the pixel PX (n, m).

The inverter 532 includes a P-type transistor PM3 and an N-type transistor NM1. The gate of each of the P-type transistor PM3 and the N-type transistor NM1 is coupled to the node N6. The source and the body of the P-type transistor PM3 are coupled to a power supply node VDD. The source and the body of the N-type transistor NM1 are coupled to a ground node VSS. The drain of each of the P-type transistor PM3 and the N-type transistor NM1 is coupled to the node N7. As a result, the inverter 532 forms a current path between the node N7 and the power supply node VDD when the voltage of the node N6 is at the "L" level, and raises the voltage of the node N7 to the "H" level. On the other hand, the inverter 532 forms a current path between the node N7 and the ground node VSS when the voltage of the node N6 is at the "H" level, and lowers the voltage of the node N7 to the "L" level.

The second shift circuit 533 includes a P-type transistor PM4 and an N-type transistor NM2. The source of the P-type transistor PM4 is coupled to the node N7. The drain of the P-type transistor PM4 is coupled to the output terminal TR. The output terminal TR of the shift circuit 53 of the pixel PX (n, m) is coupled to an input terminal FL of the shift circuit 53 of the pixel PX (n+1, m). The body of the P-type transistor PM4 is coupled to a power supply node VDD. The gate of the P-type transistor PM4 is coupled to the node N8. The drain of the N-type transistor NM2 is coupled to the node N7. The source of the N-type transistor NM2 is coupled to the node N9. The body of the N-type transistor NM2 is coupled to a ground node VSS. The gate of the N-type transistor NM2 is coupled to the node N8.

The control signal R-Shiftx is input to the node N8. The control signal R-Shiftx is, for example, generated by the logic circuit in the controller 10 and the light detector 32. The second shift circuit 533 transfers the column selection signal input to the pixel PX (n, m) to the input terminal FL of the shift circuit 53 of the pixel PX (n+1, m) via the output terminal TR when the control signal R-Shiftx is at the "L" level. On the other hand, the second shift circuit 533 transfers the column selection signal input to the pixel PX (n, m) to the node N9 when the control signal R-Shiftx is at the "H" level. That is, the second shift circuit 533 has a function of transferring the column control signal to the pixel PX (n+1, m) based on the control of the control signal R-Shiftx by the logic circuit in the controller 10 and the light detector 32.

The input terminal FL is coupled to the node N9. That is, a column selection signal output via an output terminal TR of the shift circuit 53 of the pixel PX (n−1, m) can be input to the node N9 of the shift circuit 53 of the pixel PX (n, m). Specifically, when the control signal R-Shiftx is at the "L" level, a column selection signal input to the pixel PX (n−1, m) is input to the node N9 of the shift circuit 53 of the pixel PX (n, m).

The inverter 534 includes a P-type transistor PM5 and an N-type transistor NM3. The gate of each of the P-type transistor PM5 and the N-type transistor NM3 is coupled to the node N9. The source and the body of the P-type transistor PM5 are coupled to a power supply node VDD. The source and the body of the N-type transistor NM3 are coupled to a ground node VSS. The drain of each of the P-type transistor PM5 and the N-type transistor NM3 is coupled to the node N10. As a result, the inverter 534 forms a current path between the node N10 and the power supply node VDD when the voltage of the node N9 is at the "L" level, and raises the voltage of the node N10 to the "H" level. On the other hand, the inverter 534 forms a current path between the node N10 and the ground node VSS when the voltage of the node N9 is at the "H" level, and lowers the voltage of the node N10 to the "L" level.

The node N10 is coupled to a column selection line CSL (n, m+1). That is, the voltage of the node N10 corresponds to a column selection signal input to the pixel PX (n, m+1). The column selection signal input to the shift circuit 53 is transferred to the next shift circuit 53 via an even number of inverters. Therefore, a logic level of the column selection signal input to the shift circuit 53 and that of the column selection signal transferred to the pixels PX (n−1, m+1), PX (n, m+1), or PX (n+1, m+1) by said shift circuit 53 match.

The above-described circuit configuration of the shift circuit 53 is only an example. The shift circuit 53 of each pixel PX may have a function of transferring an input column selection signal to any one of a pixel PX adjacent in the Y direction (row direction) and two pixels PX sandwiching in the X direction (column direction) said pixel PX adjacent in the Y direction. The shift circuit 53 may be omitted when the light detector 32 does not utilize the shift function in the active area. For example, each of the control signals L_Shiftx and R_Shiftx is generated by the controller 10, and is generated for each row in a peripheral circuit in the light detector 32.

Further, the shift circuit 53 may have other circuit configurations as long as the functions described above can be realized. FIG. 11 depicts a circuit diagram showing another configuration example of the shift circuit 53 included in the pixel PX included in the light detector 32 according to the first embodiment. Calculation results "A", "B", and "C" shown in FIG. 11 are calculated by "A=/R·/L+R·L", "B=R·/L", and "C=/R·L", respectively. The "R" and "L" in these formulae correspond to the control signals R-Shiftx and L-Shiftx, respectively. A signal with "/" at the beginning of the signal name indicates that it is an inverted signal.

As shown in FIG. 11, a shift circuit 53A includes NAND circuits 200, 210, 220, and 230. A column selection line CSL (n, m) and the calculation result "A" are input to the NAND circuit 200. A column selection line CSL (n−1, m) and the calculation result "B" are input to the NAND circuit 210. A column selection line CSL (n+1, m) and the calculation result "C" are input to the NAND circuit 220. An output of each of the NAND circuits 200, 210, and 220 is input to the NAND circuit 230. An output of the NAND circuit 230 is coupled to a column selection line CSL (n, m+1).

The shift circuit 53A can also operate in the same manner as the shift circuit 53. As described above, the shift circuit included in the light detector 32 according to the first embodiment is not limited to the shift circuit 53 using the transfer gate as shown in FIG. 10, and may be the shift circuit 53A not using a transfer gate as shown in FIG. 11. However, the shift circuit 53A has larger numbers of transistors per pixel PX and shift control lines than those of the shift circuit 53. The circuit configuration of the shift circuit 53 can be freely designed according to the layout of the light detector 32.

[1-2-2] Outline of Operation of SPAD

FIG. 12 depicts a schematic diagram showing an example of a structure of an avalanche photodiode APD and an operation principle of a single-photon avalanche diode SPAD included in the light detector 32 according to the first embodiment. As shown in FIG. 12, the avalanche photodiode APD according to the first embodiment includes a semiconductor substrate SUB, P-type semiconductor layers EP and PDP, and an N-type semiconductor layer PDN.

The semiconductor substrate SUB is, for example, a P-type semiconductor substrate. The P-type semiconductor layers EP and PDP and the N-type semiconductor layer PDN are stacked in this order on the semiconductor substrate SUB. The P-type semiconductor layer EP is, for example, an epitaxial layer, and is formed thicker than the P-type semiconductor layer PDP. The concentration of P-type impurities doped in the P-type semiconductor layer PDP is higher than that of P-type impurities doped in the P-type semiconductor layer EP. A PN junction is formed at a contact portion between the P-type semiconductor layer PDP and the N-type semiconductor layer PDN. Thereby, the P-type semiconductor layer PDP and the N-type semiconductor layer PDN are used as the anode and the cathode of the avalanche photodiode APD, respectively.

In the light detector 32, the avalanche photodiode APD is used in a Geiger mode. Then, a SPAD using the avalanche photodiode APD detects light in units of photons, and converts the light into an electric signal. In the following, an operation principle of the SPAD using the avalanche photodiode APD shown in FIG. 12 will be described.

When a high reverse bias is applied to the avalanche photodiode APD, a strong electric field is generated between the P-type semiconductor layer PDP and the N-type semiconductor layer PDN (FIG. 12 (1)). Accordingly, a depletion layer is formed over an area from the PN junction portion between the P-type semiconductor layer PDP and the N-type semiconductor layer PDN to the P-type semiconductor layer EP (FIG. 12 (2)). At this time, the avalanche photodiode APD enters a state (hereinafter, referred to as an active state) capable of detecting light. When the avalanche photodiode APD in the active state is irradiated with light, some energy of the light reaches the depletion layer (FIG. 12 (3)). As a result, a pair of an electron and an electron hole, i.e., a carrier, is generated in the depletion layer (FIG. 12 (4)).

The carrier generated in the depletion layer drifts due to a strong electric field in the vicinity of the PN junction (FIG. 12 (5)). Specifically, the electron hole of the generated carrier is accelerated toward the semiconductor substrate SUB side, and the electron of the generated carrier is accelerated toward the N-type semiconductor layer PDN side. The electron accelerated toward the N-type semiconductor layer PDN side collides with an atom under the strong electric field in the vicinity of the PN junction. As a result, the electron that collided with the atom ionizes said atom, and generates a new pair of an electron and an electron hole. Such generation of a pair of an electron and an electron hole is repeated if a voltage of a reverse bias applied to the avalanche photodiode APD exceeds a breakdown voltage of the avalanche photodiode APD (FIG. 12 (6) Avalanche breakdown).

When the avalanche breakdown occurs, the avalanche photodiode APD discharges an electric current (FIG. 12 (7) Geiger discharge). The electric current output from the avalanche photodiode APD, for example, flows in the quench resistor Rq. As a result, a voltage drop occurs in the output node OUT of the pixel PX (FIG. 12 (8) Quenching). By quenching, when the voltage of the reverse bias applied to the avalanche photodiode APD drops below the breakdown voltage, the Geiger discharge is stopped. Then, a recovery current flows into the avalanche photodiode APD, and charging of the capacity at the PN junction is performed. Some time after the Geiger discharge is stopped, the avalanche photodiode APD returns to a state capable of detecting light.

The avalanche photodiode APD included in the pixel PX may have other structures. For example, the P-type semiconductor layer PDP may be omitted. The thickness of each of the P-type semiconductor layer EP, P-type semiconductor layer PDP, and N-type semiconductor layer PDN can be changed according to the design of the avalanche photodiode APD. The PN junction of the avalanche photodiode APD may be formed at a contact portion between the semiconductor substrate SUB and the semiconductor layer on the semiconductor substrate SUB. The avalanche photodiode APD may have a structure in which the P-type semiconductor layer and the N-type semiconductor layer shown in FIG. 12 are replaced with each other.

[1-2-3] Active Area Setting Example

In the following, an active area setting example for the light detector 32 will be described.

Reflected light L2 incident on the distance measuring device 1 according to the first embodiment is applied to a part of the light detector 32 based on a scanning position of outgoing light L1 and a design of the optical system 31. The controller 10 sets each pixel PX to an active state or an inactive state based on an irradiation position of the reflected light L2. Hereinafter, a pixel PX in the active state is also referred to as an "on pixel", and a pixel PX in the inactive state is also referred to as an "off pixel". That is, an area including an on pixel corresponds to the active area of the light detector 32. The active area is set for each outgoing light L1 in the measurement operation of the distance measuring device 1.

In setting the active area, the controller 10 selects, for example, an X coordinate and a Y coordinate of a pixel PX associated with an inclination of the mirror 25 at a timing when the outgoing light L1 is emitted. Then, the controller 10 reports the selected X coordinate and Y coordinate to the light detector 32. Then, the light detector 32 sets the active area based on the X coordinate and the Y coordinate reported (selected) by the controller 10.

The X coordinate and the Y coordinate used in setting of the active area indicate, for example, coordinates of an upper-left pixel PX of the active area. When multichannel scanning is performed, the active area is formed by a plurality of on pixels arranged along a direction (e.g., the Y direction) intersecting the scanning direction. Note that the active area may have an expanse in the scanning direction (e.g., the X direction). The position and shape of the active area may be set based at least on a coordinate designated by the controller 10.

The light detector 32 outputs a light reception result by a pixel PX in the active area AA, for example, for each pixel PX sharing a row address RA. Thereby, noise from a pixel PX outside the active area is canceled from the light reception result of the light detector 32, and an S/N ratio of the light reception result increases. In addition, application of a voltage to the pixel PX outside the active area is appropriately omitted so that power consumption of the light detector 32 is suppressed.

In addition, in the distance measuring device 1 according to the first embodiment, the light detector 32 can change the shape of the active area with the shift circuit 53. In the following, in multichannel raster scanning, active area setting examples of the case where the shift function of the shift circuit 53 is not used and the case where the shift function of the shift circuit 53 is used will be described in order.

(Active Area Setting Example when Shift Function is not Used)

Figure 13:
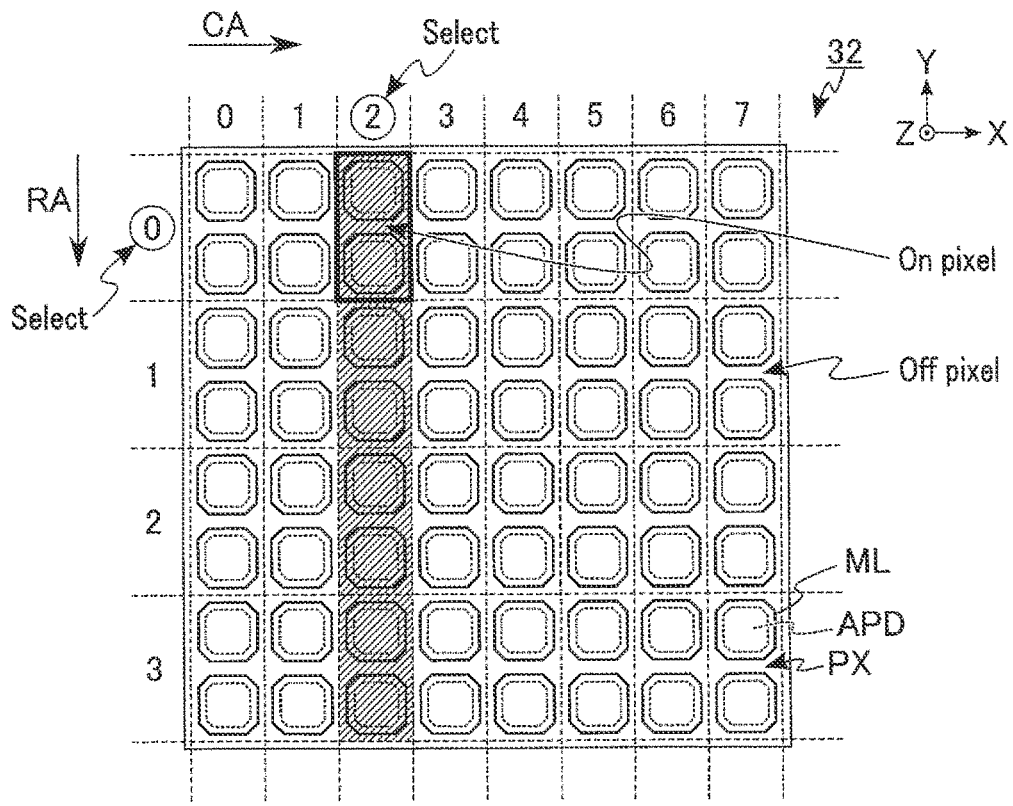
FIG. 13 depicts a plan view showing an example of setting of an active area in the light detector according to the first embodiment.

FIG. 13 depicts a plan view showing an example of active area setting in the light detector 32 according to the first embodiment, exemplifying active area setting of the case where the shift function is not used. In addition, FIG. 13 displays a portion corresponding to X coordinates "0" to "7" associated with the column address CA and Y coordinates "0" to "3" associated with the row address RA in the light detector 32. The selected pixel PX is enclosed by a thick line. Hatching is added to on pixels.

As shown in FIG. 13, when coordinates (2 (X coordinate), 0 (Y coordinate)) are selected, the light detector 32 sets a plurality of pixels PX along the row direction (Y direction) to on pixels with a selected pixel PX as a reference. In this example, based on the pixel PX at coordinates (2, 0) being selected, the light detector 32 sets each of a pixel PX at coordinates (2, 1), a pixel PX at coordinates (2, 2), and a pixel PX at coordinates (2, 3) to an on pixel, and sets the other pixels PX to off pixels. That is, an active area is formed by the pixel PX of each of the coordinates (2, 0), (2, 1), (2, 2), and (2, 3). Then, the pixel PX of each of the coordinates (2, 0), (2, 1), (2, 2), and (2, 3) independently outputs a light reception result.

In the case where the shift function is not used, the controller 10, for example, sets each of the control signals L_Shiftx and R_Shiftx to the "H" level. Then, for example, a column selection signal input to the shift circuit 53 of the pixel PX (n, m) is transferred to the pixel PX (n, m+1). As a result, an active area in which the on pixels adjacent to each other on the lower side are adjacent in the Y direction is set with the selected pixel PX as a reference. Note that the number of pixels PX set to on pixels with selected coordinates as a reference can be freely set in each of the X direction and the Y direction.

(Active Area Setting Example when Shift Function is Used)

Figure 14:
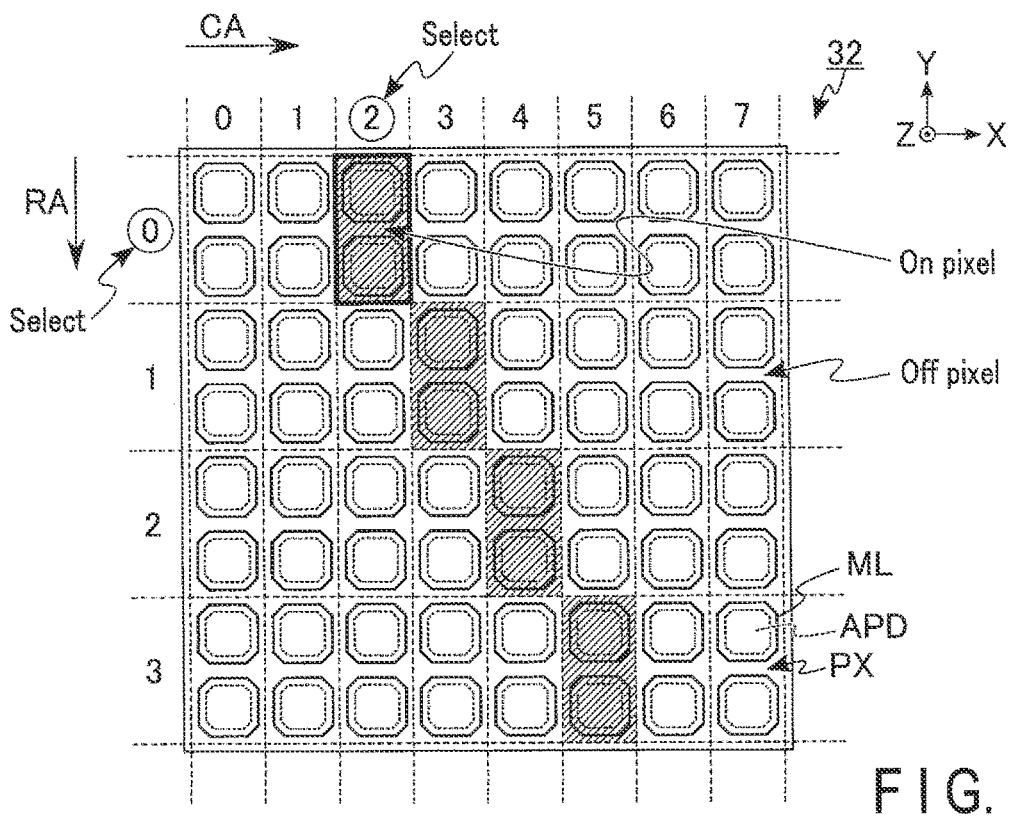
FIG. 14 depicts a plan view showing an example of setting of an active area in the light detector according to the first embodiment.

FIG. 14 depicts a plan view showing an example of active area setting in the light detector 32 according to the first embodiment, exemplifying active area setting in the case where the shift function is used. In addition, FIG. 14 displays a portion corresponding to X coordinates "0" to "7" associated with the column address CA and Y coordinates "0" to "3" associated with the row address RA in the light detector 32. The selected pixel PX is enclosed by a thick line. Hatching is added to an on pixel.

As shown in FIG. 14, when coordinates (2 (X coordinate), 0 (Y coordinate)) are selected, the light detector 32 sets a plurality of pixels PX along the row direction (Y direction) to on pixels with a selected pixel PX as a reference, and in this example, shifts the active area to the right side (the positive side of the X coordinate). Specifically, based on the pixel PX at coordinates (2, 0) being selected, the light detector 32 sets each of a pixel PX at coordinates (3, 1), a pixel PX at coordinates (4, 2), and a pixel PX at coordinates (5, 3) to an on pixel, and sets the other pixels PX to off pixels. That is, an active area is formed by the pixel PX of each of the coordinates (2, 0), (3, 1), (4, 2), and (5, 3). Then, the pixel PX of each of the coordinates (2, 0), (3, 1), (4, 2), and (5, 3) independently outputs a light reception result.

In the case where the active area is shifted to the right side (the positive side of the X coordinate), the controller 10, for example, sets the control signal L_Shiftx to the "H" level and the control signal R_Shiftx to the "L" level. Then, for example, the shift circuit 53 of the pixel PX (n, m) transfers an input column selection signal to the pixel PX (n+1, m+1). As a result, an active area in which the on pixels adjacent to each other on the lower side are shifted to the right side one pixel at a time is set with the selected pixel PX as a reference. An operation of a case of shifting an active area to the left side (the negative side of the X coordinate) is the same as that of the case of shifting the active area to the right side except that the shift direction is opposite.

Note that the controller 10 can use the shift function as appropriate according to the scanning position. The number of pixels PX set to on pixels with selected coordinates as a reference can be freely set in each of the X direction and the Y direction. The shift function of the active area by the shift circuit 53 can also be used in a case where a plurality of pixels PX arranged in the X direction are set to the active state in the same manner.

[1-3] Structure of Light Detector 32

In the following, an example of a structure of the light detector 32 included in the distance measuring device 1 according to the first embodiment will be described. In the drawings to be referred to hereinafter, the Z direction corresponds to a vertical direction with respect to a top surface of a semiconductor substrate used for forming the light detector 32. In the plan views, hatching is added as appropriate to facilitate visualization of the drawings. The hatching added to the plan views, however, may not necessarily relate to the materials or properties of the hatched structural components. In the cross-sectional views, some structures are omitted as appropriate to facilitate visualization of the drawings. Upper, lower, left, and right sides correspond to upper, lower, left, and right sides on the paper where the drawing is described, respectively.

[1-3-1] Planar Layout of Light Detector 32

Figure 15:
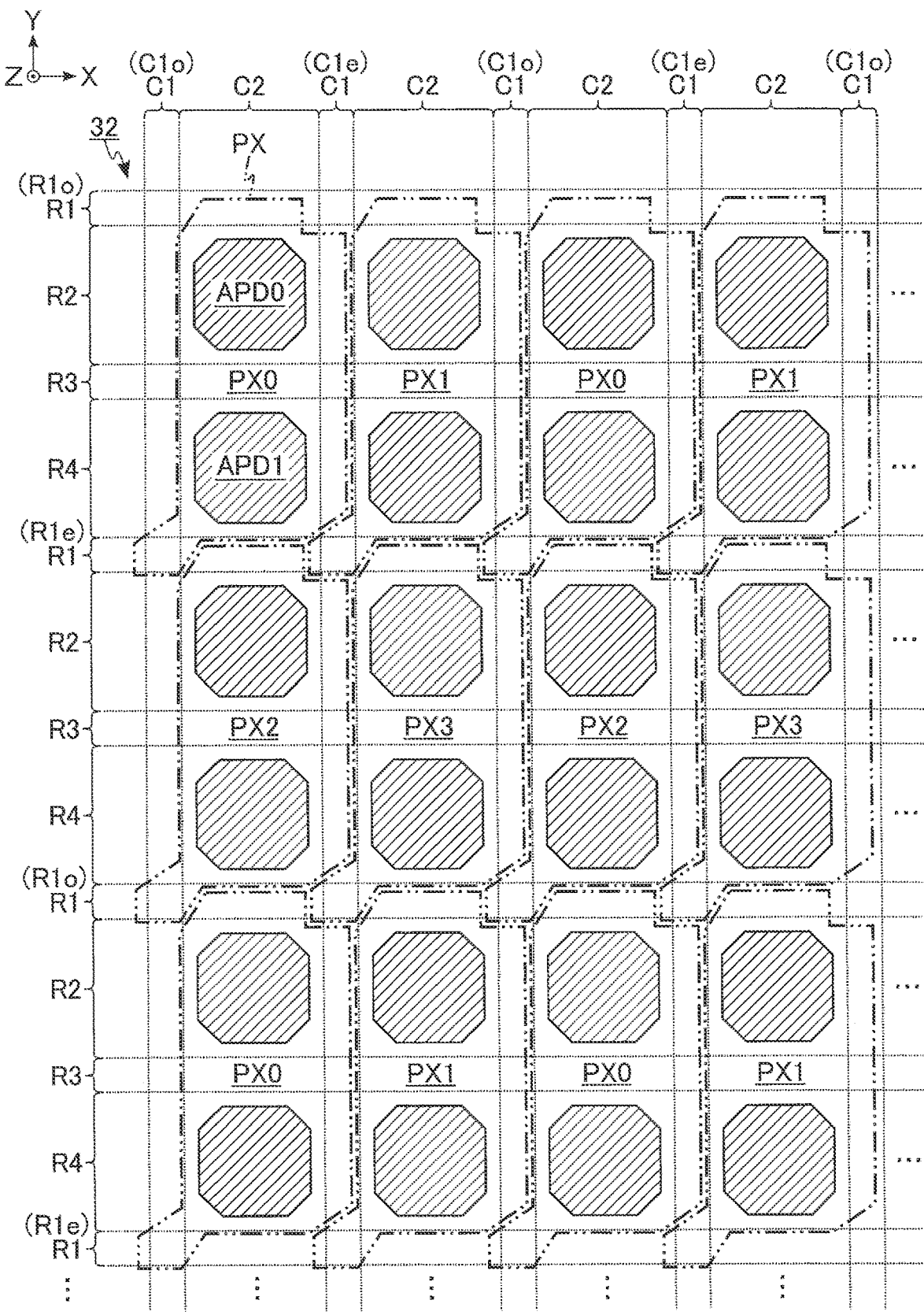
FIG. 15 depicts a plan view showing an example of a planar layout of the light detector according to the first embodiment.

FIG. 15 depicts a plan view showing an example of a planar layout of the light detector 32 according to the first embodiment, displaying detailed shapes of the pixels PX and arrangement of the avalanche photodiodes APD. As shown in FIG. 15, the light detector 32 includes a plurality of regions C1 and C2 divided along the X direction, and includes a plurality of regions R1, R2, R3, and R4 divided along the Y direction.

A set of the regions C1 and C2 is repeatedly arranged in the X direction. A set of regions R1, R2, R3, and R4 is repeatedly arranged in the Y direction. In the following, to simplify the descriptions, an odd-numbered region C1 is also referred to as "C1o", and an even-numbered region C1 is also referred to as "C1e". In the same manner, an odd-numbered region R1 is also referred to as "R1o", and an even-numbered region R1 is also referred to as "R1e".

The avalanche photodiode APD is arranged in each region (C2, R2) in which a region C2 and a region R2 overlap each other. Each pixel PX includes two avalanche photodiodes APD0 and APD1 adjacent in the Y direction. A plurality of pixels PX are arranged in a matrix. Circuit elements included in each pixel PX are arranged by being dispersed in an area in the vicinity of two avalanche photodiodes APD constituting the pixel PX.

Focusing on a pixel PX0 corresponding to a portion surrounded by the right side of a region C1o, the left side of a region C1e, the lower side of a region R1o, and the upper side of a region R1e, the circuit elements of the pixel PX0 are arranged by being respectively dispersed in a region (C1o, R1e) where the region C1o and the region R1e overlap, a region (C2, R1o) where a region C2 and the region R1o overlap, a region (C2, R3) where the region C2 and a region R3 overlap, a region (C1e, R2) where the region C1e and a region R2 overlap, and a region (C1e, R4) where the region C1e and a region R4 overlap.

Focusing on a pixel PX1 corresponding to a portion surrounded by the right side of a region C1e, the left side of a region C1o, the lower side of a region R1o, and the upper side of a region R1e, the circuit elements of the pixel PX1 are arranged by being respectively dispersed in a region (C1e, R1e) where the region C1e and the region R1e overlap, a region (C2, R1o) where a region C2 and the region R1o overlap, a region (C2, R3) where the region C2 and a region R3 overlap, a region (C1o, R2) where the region C1o and a region R2 overlap, and a region (C1o, R4) where the region C1o and a region R4 overlap.

Focusing on a pixel PX2 corresponding to a portion surrounded by the right side of a region C1o, the left side of a region C1e, the lower side of a region R1e, and the upper side of a region R1o, the circuit elements of the pixel PX2 are arranged by being respectively dispersed in a region (C1o, R1o) where the region C1o and the region R1o overlap, a region (C2, R1e) where a region C2 and the region R1e overlap, a region (C2, R3) where the region C2 and a region R3 overlap, a region (C1e, R2) where the region C1e and a region R2 overlap, and a region (C1e, R4) where the region C1e and a region R4 overlap.

Focusing on a pixel PX3 corresponding to a portion surrounded by the right side of a region C1e, the left side of a region C1o, the lower side of a region R1e, and the upper side of a region R1o, the circuit elements of the pixel PX3 are arranged by being respectively dispersed in a region (C1e, R1o) where the region C1e and the region R1o overlap, a region (C2, R1e) where a region C2 and the region R3e overlap, a region (C2, R3) where the region C2 and a region R3 overlap, a region (C1o, R2) where the region C1o and a region R2 overlap, and a region (C1o, R4) where the region C1o and a region R4 overlap.

The pixels PX0 and PX1 are alternately arranged in the X direction. The pixels PX2 and PX3 are alternately arranged in the X direction. The pixels PX0 and PX2 are alternately arranged in the Y direction. The pixels PX1 and PX3 are alternately arranged in the Y direction. In each of regions (C1, R1), (C2, R1), (C2, C3), (C1, R2), and (C1, R4), configurations of the arranged circuit elements are common for each pixel PX.

In other words, the circuit element in the region (C1, R1) is associated with a pixel PX adjacent on the upper right side. The circuit element in the region (C2, R1) is associated with a pixel PX adjacent on the lower side. The region (C2, R3) is associated with a pixel PX including avalanche photodiodes APD0 and APD1 sandwiching said region (C2, R3). The circuit element in the region (C1, R2) is associated with a pixel PX adjacent on the left side. The circuit element in the region (C1, R4) is associated with a pixel PX adjacent on the left side.

As described above, circuit elements included in a pixel PX are arranged asymmetrically in the vicinity of said pixel PX. Thus, the shape of the pixel PX is asymmetric in each of the X direction and the Y direction. Note that the shape of the pixel PX may be other shapes. For example, the shape of the pixel PX shown in FIG. 15 may be inverted right and left, upside down, or both right and left and upside down. Circuit elements included in a pixel PX may be arranged at least in the vicinity of avalanche photodiodes APD constituting said pixel PX. The shape of a pixel PX can be changed appropriately according to the arrangement of circuit elements included in the pixel PX.

[1-3-2] Planar Layout of Pixel PX

Next, an example of a detailed planar layout of a pixel PX will be described. Note that the pixels PX0 to PX3 have mutually similar planar layouts. Thus, in the following, the pixel PX will be described with a focus on the pixel PX0. Each of FIGS. 16 and 17 depicts a plan view showing an example of a planar layout of a pixel PX included in the light detector 32 according to the first embodiment.

Figure 16:
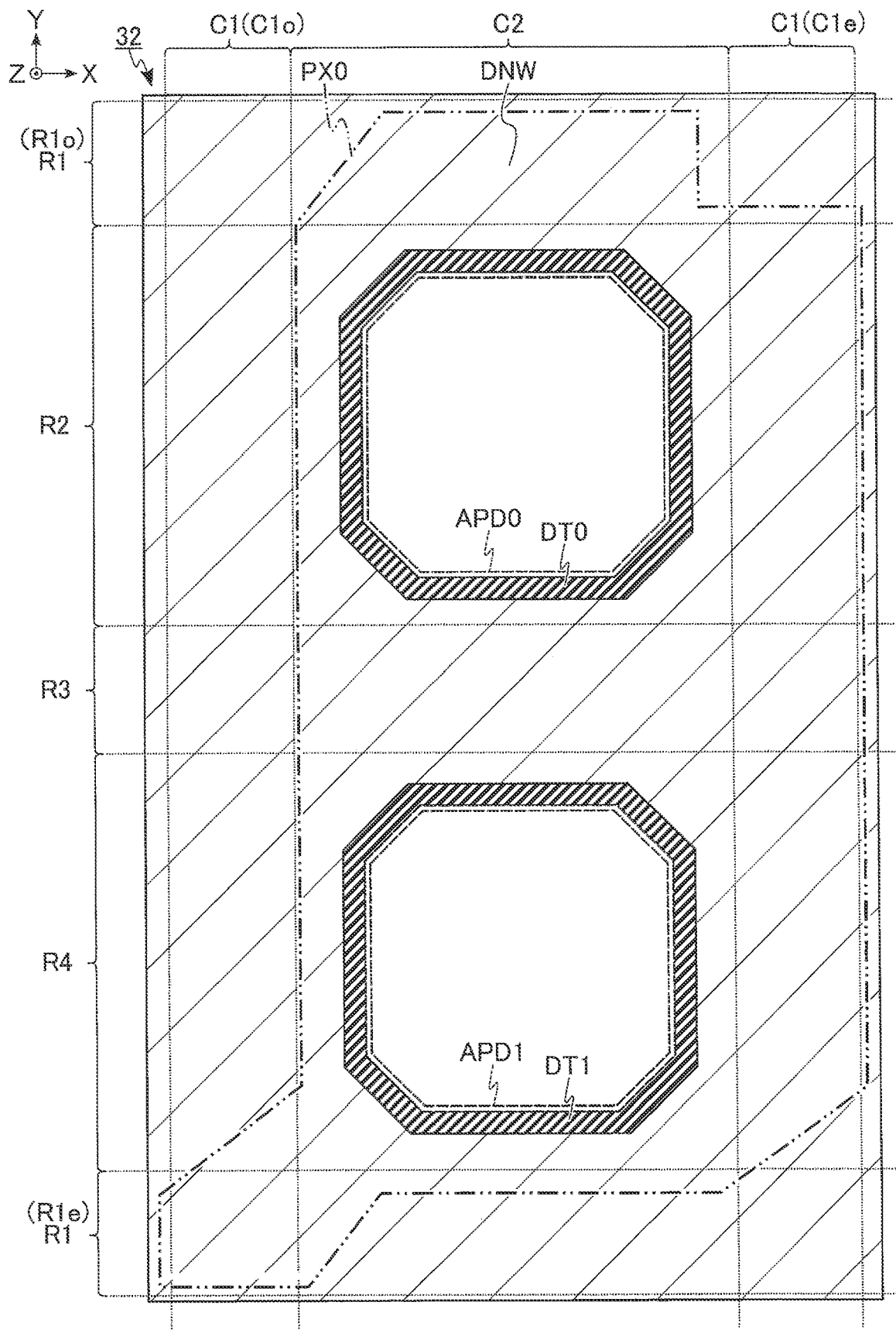
FIG. 16 depicts a plan view showing an example of a planar layout of a pixel included in the light detector according to the first embodiment.
Figure 17:
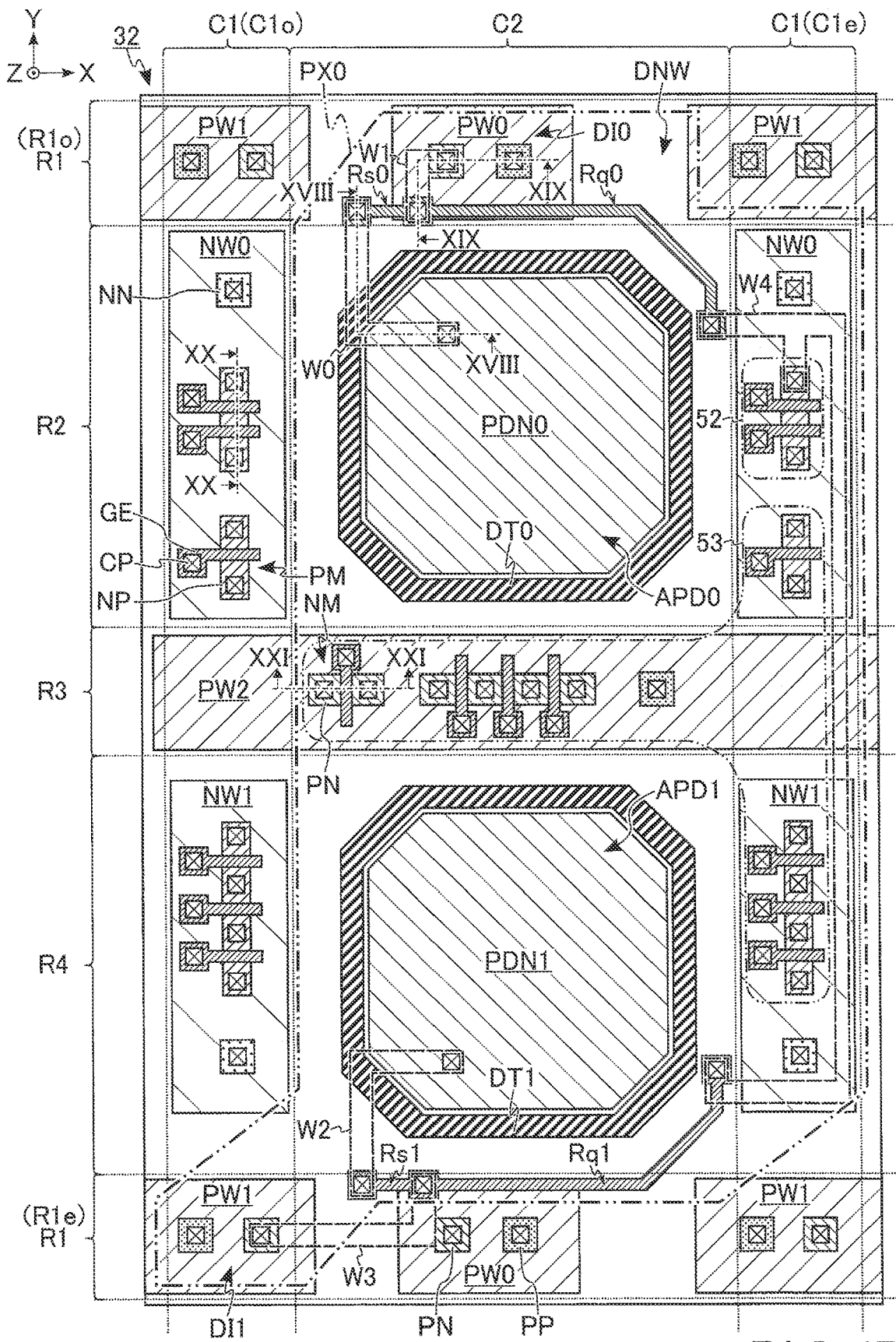
FIG. 17 depicts a plan view showing an example of a planar layout of a pixel included in the light detector according to the first embodiment.

FIG. 16 shows an enlarged area including the pixel PX0, and displays a planar layout of a part of the configuration included in the light detector 32. As shown in FIG. 16, the light detector 32 includes a plurality of trench portions DT and a well region DNW.

Each of the plurality of trench portions DT has a structure in which an insulator or metal, etc. is embedded. Each trench portion DT is provided in an annular shape surrounding an avalanche photodiode APD. A planar shape of the trench portion DT is, for example, an octagonal ring shape. The well region DNW is a semiconductor region containing N-type impurities. The well region DNW is provided, for example, in a region not surrounded by each trench portion DT.

Specifically, the region in which the pixel PX0 is formed includes trench portions DT0 and DT1. The trench portions DT0 and DT1 are provided in the regions (C2, R2) and (C2, R4), respectively. The trench portion DT0 surrounds a region in which an avalanche photodiode APD0 is formed. The trench portion DT1 surrounds a region in which an avalanche photodiode APD1 is formed. In other words, the trench portion DT0 is provided between the well region DNW and the avalanche photodiode APD0. The trench portion DT1 is provided between the well region DNW and the avalanche photodiode APD1.

FIG. 17 shows an area overlapped with FIG. 16, and displays a planar layout of a part of the configuration included in the light detector 32. As shown in FIG. 17, in the region where the pixel PX0 is formed, the light detector 32 further includes, for example, N-type semiconductor layers PDN0 and PDN1, well regions PW0, PW1 and PW2, well regions NW0 and NW1, a plurality of contact plugs CP, and a plurality of gate electrodes GE.

Each of the N-type semiconductor layers PDN0 and PDN1 is a semiconductor region containing N-type impurities. The N-type semiconductor layers PDN0 and PDN1 are surrounded by the trench portions DT0 and DT1, respectively. The N-type semiconductor layers PDN0 and PDN1 are used as a part of the avalanche photodiodes APD0 and APD1, respectively. At least one contact plug CP is coupled to each of the N-type semiconductor layers PDN0 and PDN1.

Each of the well regions PW0, PW1, and PW2 is a semiconductor region containing P-type impurities. The well region PW0 is arranged in each region (C2, R1). The well region PW1 is arranged in each region (C1, R1). The well region PW2 extends in the X direction, and is arranged in each region R3. Each of the well regions PW0 and PW1 includes an N-type semiconductor region PN and a P-type semiconductor region PP. The well region PW2 includes at least one N-type semiconductor region PN and a P-type semiconductor region PP. The concentration of N-type impurities contained in the N-type semiconductor region PN is higher than that of P-type impurities contained in the well region PW. The concentration of P-type impurities contained in the P-type semiconductor region PP is higher than that of P-type impurities contained in the well region PW. A contact plug CP is coupled to each of the N-type semiconductor region PN and the P-type semiconductor region PP.

The well region PW0 is coupled to the interconnect W1 via the contact plug CP coupled to the N-type semiconductor region PN, and is coupled to the node N2 via the contact plug CP coupled to the P-type semiconductor region PP. A contact portion between the well region PW0 and the N-type semiconductor region PN forms a PN junction that functions as a part of the diode DI0.

The well region PW1 is coupled to the interconnect W3 via the contact plug CP coupled to the N-type semiconductor region PN, and is coupled to the node N2 via the contact plug CP coupled to the P-type semiconductor region PP. A contact portion between the well region PW1 and the N-type semiconductor region PN forms a PN junction that functions as a part of the diode DI1.

At least one gate electrode GE is provided so as to overlap each N-type semiconductor region PN in the well region PW2. Then, at least two contact plugs CP are coupled to each N-type semiconductor region PN in the well region PW2 so as to sandwich at least one gate electrode GE. A portion where the N-type semiconductor region PN and the gate electrode GE are combined in the well region PW2 functions as an N-type transistor NM. Further, a voltage is applied to the body of the N-type transistor NM provided in the well region PW2 via the contact plug CP coupled to the P-type semiconductor region PP. For example, four N-type transistors NM are provided in the well region PW2.

Each of the well regions NW0 and NW1 is a semiconductor region containing N-type impurities. The well region NW0 is arranged in each region (C1, R2). The well region NW1 is arranged in each region (C1, R4). Each of the well regions NW0 and NW1 includes at least one P-type semiconductor region NP and an N-type semiconductor region NN. The concentration of P-type impurities contained in the P-type semiconductor region NP is higher than that of N-type impurities contained in the well region NW. The concentration of N-type impurities contained in the N-type semiconductor region NN is higher than that of N-type impurities contained in the well region NW. At least one contact plug CP is coupled to each of the P-type semiconductor region NP and the N-type semiconductor region NN.

At least one gate electrode GE is provided so as to overlap each N-type semiconductor region PN in the well region NW0. Then, at least two contact plugs CP are coupled to each P-type semiconductor region NP in the well region NW0 so as to sandwich at least one gate electrode GE. A portion where the P-type semiconductor region NP and the gate electrode GE are combined in the well region PW0 functions as a P-type transistor PM. Further, a voltage is applied to the body of the P-type transistor PM provided in the well region NW0 via the contact plug CP coupled to the N-type semiconductor region NN. In the well region NW0, for example, three P-type transistors PM are provided.

At least one gate electrode GE is provided so as to overlap each N-type semiconductor region PN in the well region NW1. Then, at least two contact plugs CP are coupled to each P-type semiconductor region NP in the well region NW1 so as to sandwich at least one gate electrode GE. A portion where the P-type semiconductor region NP and the gate electrode GE are combined in the well region PW1 functions as a P-type transistor PM. Further, a voltage is applied to the body of the P-type transistor PM provided in the well region NW1 via the contact plug CP coupled to the N-type semiconductor region NN. In the well region NW1, for example, three N-type transistors NM are provided.

The selection circuit 52 of the pixel PX0 is composed of, for example, two P-type transistors PM arranged in the region (C1e, R2). The selection circuit 53 of the pixel PX0 is composed of, for example, one P-type transistor PM arranged in the region (C1e, R2), three P-type transistors PM arranged in the region (C1e, R4), and four N-type transistors NM arranged in the region R3.

The interconnect W0 includes, for example, a portion extending along the X direction and a portion extending along the Y direction. The interconnect W0 couples between the contact plug CP coupled to the N-type semiconductor layer PDN0 and a contact plug CP coupled to one end of the protection resistor Rs0. The protection resistor Rs0 includes, for example, a portion extending in the X direction. The other end of the protection resistor Rs0 corresponds to one end of the quench resistor Rq0. A contact plug CP is coupled to a boundary portion between the protection resistor Rs0 and the quench resistor Rq0.

The interconnect W1 includes, for example, a portion extending along the X direction and a portion extending along the Y direction. The interconnect W1 couples between a contact plug CP coupled to the boundary portion between the protection resistor Rs0 and the quench resistor Rq0 and a contact plug CP coupled to the N-type semiconductor region PN in the well region PW0. The quench resistor Rq0 includes, for example, a portion extending along a peripheral edge of the avalanche photodiode APD0. The other end of the quench resistor Rq0 is, for example, arranged in the vicinity of the region (C1e, R2). The quench resistor Rq0 may not overlap at least a region in which the avalanche photodiode APD0 is formed.

The interconnect W2 includes, for example, a portion extending along the X direction and a portion extending along the Y direction. The interconnect W2 couples between a contact plug CP coupled to the N-type semiconductor layer PDN1 and a contact plug CP coupled to one end of the protection resistor Rs1. The protection resistor Rs1 includes, for example, a portion extending in the X direction. The other end of the protection resistor Rs1 corresponds to one end of the quench resistor Rq1. A contact plug CP is coupled to a boundary portion between the protection resistor Rs1 and the quench resistor Rq1.

The interconnect W3 includes, for example, a portion extending along the X direction and a portion extending along the Y direction. The interconnect W3 couples between the contact plug CP coupled to the boundary portion between the protection resistor Rs1 and the quench resistor Rq1 and a contact plug CP coupled to the N-type semiconductor region PN in the well region PW1. The quench resistor Rq1 includes, for example, a portion extending along a peripheral edge of the avalanche photodiode APD1. The other end of the quench resistor Rq1 is, for example, arranged in the vicinity of the region (C1e, R4). The quench resistor Rq1 may not overlap at least a region in which the avalanche photodiode APD1 is formed.

The interconnect W4 couples, for example, a contact plug CP coupled to the other end of the quench resistor Rq0, a contact plug CP coupled to the other end of the quench resistor Rq1, and a contact plug CP coupled to the P-type semiconductor region NP corresponding to the P-type transistor PM forming the selection circuit 52 in the well region NW0. The interconnect W4 may be divided according to the arrangement of the circuits. Further, the divided interconnects W4 may be electrically coupled via an interconnect provided in another interconnect layer.

Paraphrasing a part of the light detector 32 according to the first embodiment described above, the well region DNW includes, in the vicinity of the upper surface, for example, the well region PW0 adjacent to the trench portion DT in the first direction, the well regions NW0 adjacent to the trench portion DT in the second direction, and the well region PW2 adjacent to the trench portion DT in the third direction. The diode DI0 is provided in the well region PW0. The P-type transistor PM is provided in the well region NW0. The N-type transistor NM is provided in the well region PW2.

Note that the light detector 32 may have a configuration in which a plurality of types of well regions are arranged around an avalanche photodiode APD and circuit elements constituting a pixel PX are appropriately assigned to the plurality of types of well regions. For example, the light detector 32 described in the first embodiment includes N-type well regions on the right and left sides of an avalanche photodiode APD, and includes P-type well regions above and below the avalanche photodiode APD. The configuration is not limited thereto, and the light detector 32 may include P-type well regions on the right and left sides of an avalanche photodiode APD and include N-type well regions above and below the avalanche photodiode APD. The design of the well regions arranged around the avalanche photodiode APD can be freely designed according to the circuit configuration of the pixel PX.

[1-3-3] Cross-Sectional Structure of Pixel PX

Next, an example of a cross-sectional structure of a pixel PX included in the light detector 32 according to the first embodiment will be described. Each of FIGS. 18 to 21 depicts a cross-sectional view showing an example of a cross-sectional structure of a pixel PX included in the light detector 32 according to the first embodiment. In the following, a cross section including an avalanche photodiode APD, a cross section including a diode DI, a cross section including an N-type transistor NM, and a cross section including a P-type transistor PM will be described in order.

(Cross Section Including Avalanche Photodiode APD)

Figure 18:
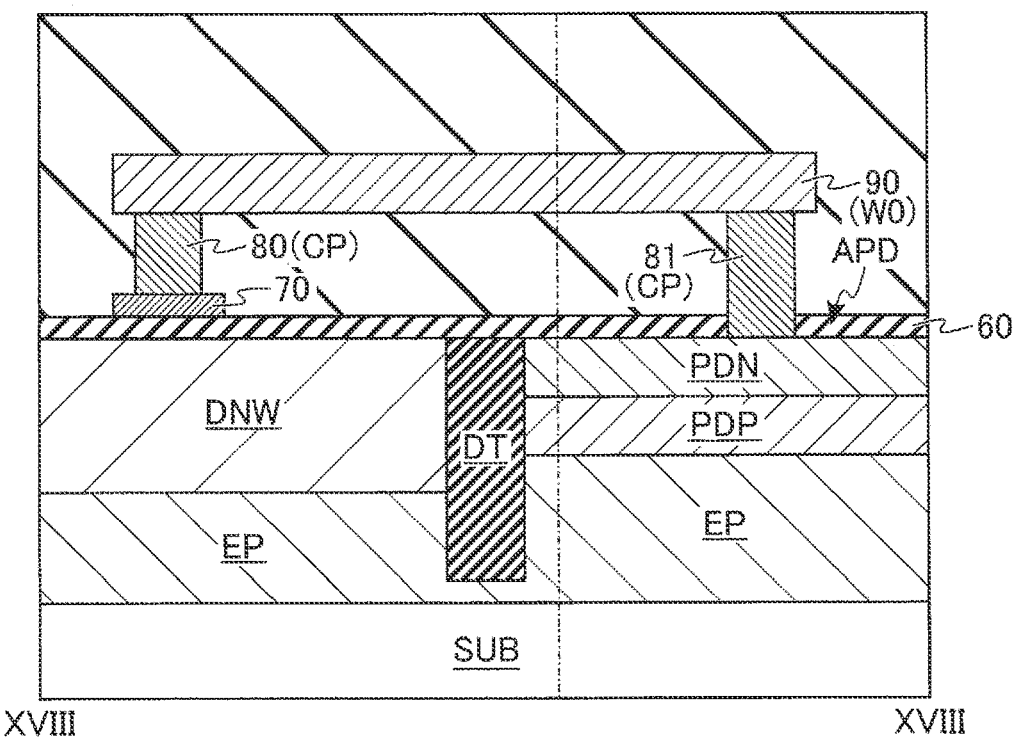
FIG. 18 depicts a cross-sectional view, taken along line XVIII-XVIII in FIG. 17, showing an example of a cross-sectional structure of the pixel included in the light detector according to the first embodiment.

FIG. 18 depicts a cross-sectional view, taken along line XVIII-XVIII of FIG. 17, showing a cross section including a coupling portion between the avalanche photodiode APD and the protection resistor Rs. A dashed line shown in FIG. 18 shows a curved portion of the cross section along the XVIII-XVIII line. As shown in FIG. 18, in the cross section including the coupling portion between the avalanche photodiode APD and the protection resistor Rs, the light detector 32 includes, for example, a semiconductor substrate SUB, a P-type semiconductor layer EP, a well region DNW, a P-type semiconductor layer PDP, an N-type semiconductor layer PDN, a trench portion DT, an insulator layer 60, a conductor layer 70, contact plugs 80 and 81, and a conductor layer 90.

Specifically, in the illustrated region, the P-type semiconductor layer EP is provided on the semiconductor substrate SUB. In the region of the avalanche photodiode APD, the P-type semiconductor layer PDP is provided on the P-type semiconductor layer EP. The N-type semiconductor layer PDN is provided on the P-type semiconductor layer PDP. These semiconductor substrate SUB, P-type semiconductor layers EP and PDP, and N-type semiconductor layer PDN correspond to the semiconductor substrate SUB, P-type semiconductor layers EP and PDP, and N-type semiconductor layer PDN described using FIG. 12, respectively. That is, the P-type semiconductor layer EP is an epitaxial layer, and a PN junction is formed by the P-type semiconductor layer PDP and the N-type semiconductor layer PDN. As a result, said portion functions as the avalanche photodiode APD.

The well region DNW is provided on the P-type semiconductor layer EP outside the region of the avalanche photodiode APD. The trench portion DT is provided between inside and outside the region of the avalanche photodiode APD. The trench portion DT divides at least the well region DNW and the set of the N-type semiconductor layer PDN and the P-type semiconductor layer PDP. Each of the N-type semiconductor layer PDN, the P-type semiconductor layer PDP, the well region DNW, and the trench portion DT is formed based on the epitaxial layer formed on the semiconductor substrate SUB. Upper surfaces of the N-type semiconductor layer PDN, the well region DNW, and the trench portion DT are aligned.

The insulator layer 60 is provided on each of the P-type semiconductor layer PDN, the well region DNW, and the trench portion DT. The insulator layer 60 is also used as a gate insulating film for an N-type transistor NM and a P-type transistor PM outside the illustrated region. The conductor layer 70 is provided above the well region DNW and on the insulator layer 60. The conductor layer 70 is, for example, polysilicon doped with impurities. The illustrated portion of the conductor layer 70 corresponds to one end of the protection resistor Rs. The contact plug 80 is provided on the conductor layer 70. The contact plug 81 is provided on the N-type semiconductor layer PDN, and penetrates the insulator layer 60. The conductor layer 90 is provided on the contact plugs 80 and 81, and couples between the contact plugs 80 and 81. The conductor layer 90 corresponds to the interconnect W0.

(Cross Section Including Diode DI)

Figure 19:
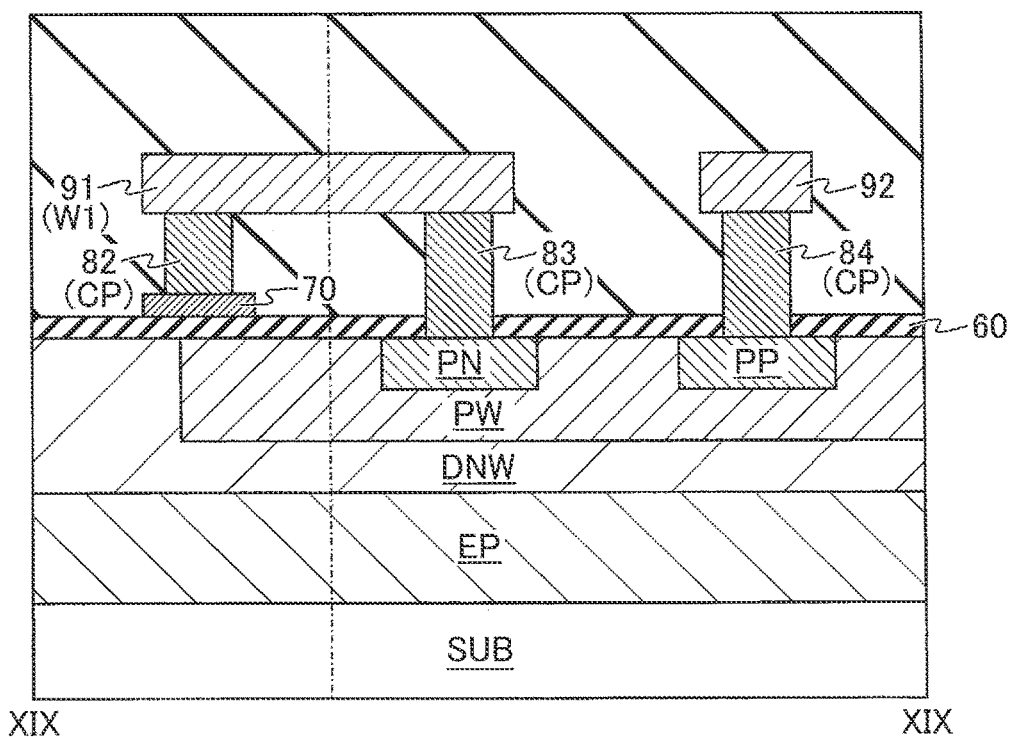
FIG. 19 depicts a cross-sectional view, taken along line XIX-XIX in FIG. 17, showing an example of a cross-sectional structure of the pixel included in the light detector according to the first embodiment.

FIG. 19 is a cross-sectional view, taken along line XIX-XIX of FIG. 17, showing a cross section including a coupling portion between the diode DI and the conductor layer 70. A dashed line shown in FIG. 19 shows a curved portion of the cross section along the XIX-XIX line. As shown in FIG. 19, in the cross section including the coupling portion between the diode DI and the conductor layer 70, the light detector 32 includes, for example, a semiconductor substrate SUB, a P-type semiconductor layer EP, well regions DNW and PW, an N-type semiconductor region PN, a P-type semiconductor region PP, an insulator layer 60, a conductor layer 70, contact plugs 82, 83, and 84, and conductor layers 91 and 92.

Specifically, in the illustrated region, the P-type semiconductor layer EP is provided on the semiconductor substrate SUB. The well region DNW is provided on the P-type semiconductor layer EP. The well region PW is provided in the vicinity of an upper surface of the well region DNW. The N-type semiconductor region PN and the P-type semiconductor region PP are respectively provided in the vicinity of an upper surface of the well region PW. Each of the well region DNW, the N-type semiconductor region PN, and the P-type semiconductor region PP is formed based on an epitaxial layer formed on the semiconductor substrate SUB. The upper surfaces of the well region DNW, the N-type semiconductor region PN, and the P-type semiconductor region PP are aligned.

The insulator layer 60 is provided on each of the well region DNW, the N-type semiconductor region PN, and the P-type semiconductor region PP. The conductor layer 70 is provided above the well region DNW and on the insulator layer 60. The illustrated portion of the conductor layer 70 corresponds to the other end of the protection resistor Rs. The contact plug 82 is provided on the conductor layer 70. The contact plug 83 is provided on the N-type semiconductor region PN, and penetrates the insulator layer 60. The contact plug 84 is provided on the P-type semiconductor region PP, and penetrates the insulator layer 60. The conductor layer 91 is provided on the contact plugs 82 and 83, and couples between the contact plugs 82 and 83. The conductor layer 91 corresponds to the interconnect W1. The conductor layer 92 is provided on the contact plug 84, and is coupled to the node N2.

(Cross Section Including N-Type Transistor NM)

Figure 20:
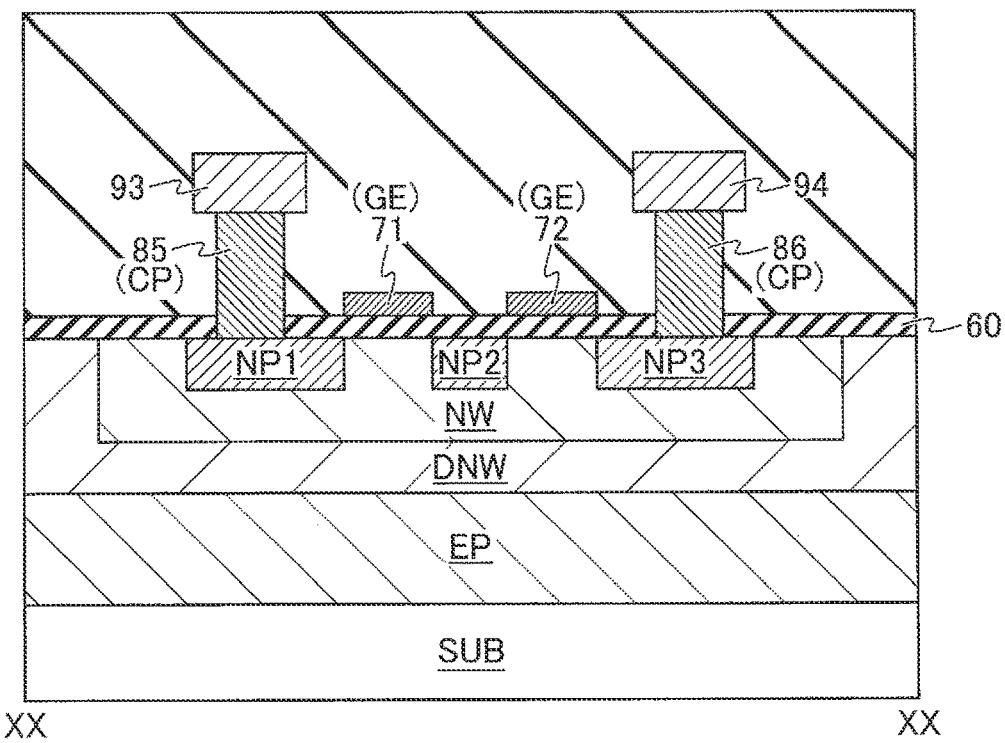
FIG. 20 depicts a cross-sectional view, taken along line XX-XX in FIG. 17, showing an example of a cross-sectional structure of the pixel included in the light detector according to the first embodiment.

FIG. 20 is a cross-sectional view, taken along line XX-XX of FIG. 17, showing a cross section including two N-type transistors NM coupled in series. As shown in FIG. 20, in a cross section including two N-type transistors NM coupled in series, the light detector 32 includes, for example, a semiconductor substrate SUB, a P-type semiconductor layer EP, well regions DNW and NW, P-type semiconductor regions NP1, NP2, and NP3, an insulator layer 60, conductor layers 71 and 72, contact plugs 85 and 86, and conductor layers 93 and 94.

Specifically, in the illustrated region, the P-type semiconductor layer EP is provided on the semiconductor substrate SUB. The well region DNW is provided on the P-type semiconductor layer EP. The well region NW is provided in the vicinity of an upper surface of the well region DNW. Each of the P-type semiconductor regions NP1, NP2, and NP3 is provided in the vicinity of an upper surface of the well region NW. Each of the well region DNW, the well region NW, and the P-type semiconductor regions NP1, NP2, and NP3 is formed based on an epitaxial layer formed on the semiconductor substrate SUB. Thus, the upper surfaces of the well region DNW, the well region NW, and the P-type semiconductor regions NP1, NP2, and NP3 are aligned.

The insulator layer 60 is provided on each of the well region NW and the P-type semiconductor regions NP1, NP2, and NP3. The conductor layer 71 is provided above a portion between the P-type semiconductor regions NP1 and NP2 and on the insulator layer 60. The conductor layer 72 is provided above a portion between the P-type semiconductor regions NP2 and NP3 and on the insulator layer 60. Each of the conductor layers 71 and 72 is, for example, polysilicon doped with impurities at a higher concentration than that of the conductor layer 70, and corresponds to the gate electrode GE of the P-type transistor PM. The contact plug 85 is provided on the P-type semiconductor region NP1, and penetrates the insulator layer 60. The contact plug 86 is provided on the P-type semiconductor region NP3, and penetrates the insulator layer 60. The conductor layer 93 is provided on the contact plug 85, and is coupled to one end of a current path of the P-type transistor PM. The conductor layer 94 is provided on the contact plug 86, and is coupled to the other end of the current path of the P-type transistor PM.

(Cross Section Including P-Type Transistor PM)

Figure 21:
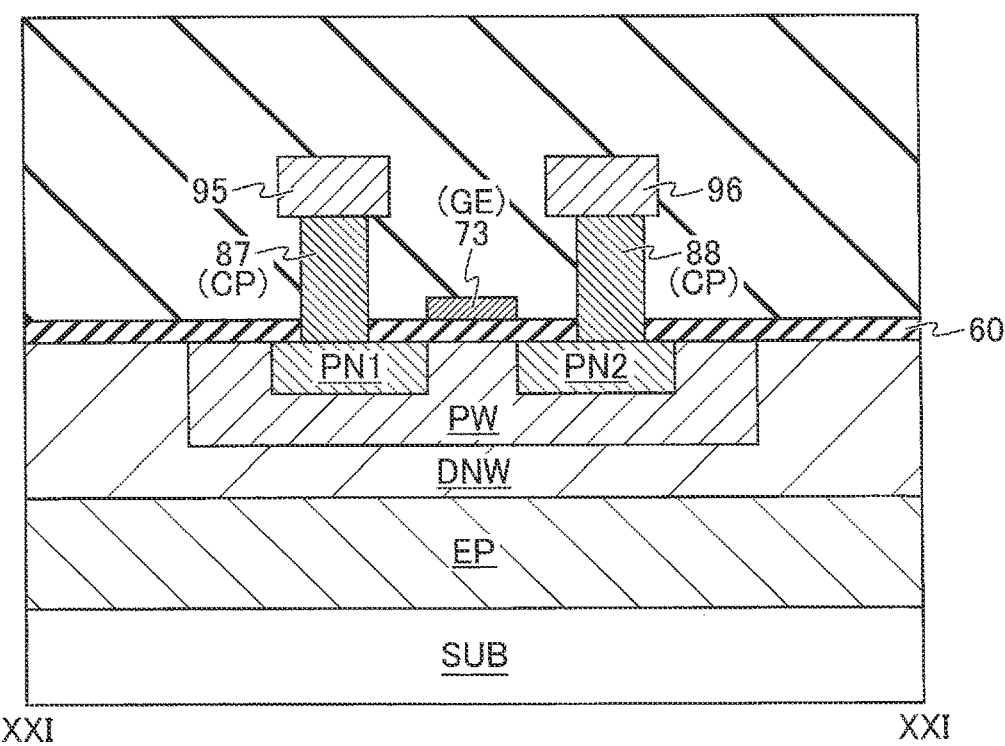
FIG. 21 depicts a cross-sectional view, taken along line XXI-XXI in FIG. 17, showing an example of a cross-sectional structure of the pixel included in the light detector according to the first embodiment.

FIG. 21 is a cross-sectional view, taken along line XXI-XXI of FIG. 17, showing a cross section including one P-type transistor PM. As shown in FIG. 21, in a cross section including one P-type transistor PM, the light detector 32 includes, for example, a semiconductor substrate SUB, a P-type semiconductor layer EP, well regions DNW and PW, N-type semiconductor regions PN1 and PN2, an insulator layer 60, a conductor layer 73, contact plugs 87 and 88, and conductor layers 95 and 96.

Specifically, in the illustrated region, the P-type semiconductor layer EP is provided on the semiconductor substrate SUB. The well region DNW is provided on the P-type semiconductor layer EP. The well region PW is provided in the vicinity of an upper surface of the well region DNW. Each of the N-type semiconductor regions PN1 and PN2 is provided in the vicinity of an upper surface of the well region PW. Each of the well region DNW, the well region PW, and the N-type semiconductor regions PN1 and PN2 is formed based on an epitaxial layer formed on the semiconductor substrate SUB. The upper surfaces of the well region DNW, the well region PW, and the N-type semiconductor regions PN1 and PN2 are aligned.

The insulator layer 60 is provided on each of the well region PW and the N-type semiconductor regions PN1 and PN2. The conductor layer 73 is provided above a portion between the N-type semiconductor regions PN1 and PN2 and on the insulator layer 60. The conductor layer 73 corresponds to the gate electrode GE of the N-type transistor NM. The contact plug 87 is provided on the N-type semiconductor region PN1, and penetrates the insulator layer 60. The contact plug 88 is provided on the N-type semiconductor region PN2, and penetrates the insulator layer 60. The conductor layer 95 is provided on the contact plug 87, and is coupled to one end of a current path of the N-type transistor NM. The conductor layer 96 is provided on the contact plug 88, and is coupled to the other end of the current path of the N-type transistor NM.

[1-4] Advantageous Effects of First Embodiment

According to the distance measuring device 1 according to the first embodiment described above, characteristics of the light detector 32 can be improved. Details of the advantageous effects of the first embodiment will be described below.

LiDAR (Light Detection and Ranging) as a type of a distance measuring system irradiates an object to be measured with a laser, senses the intensity of reflected light reflected from the object to be measured by a sensor, and converts it into a time-series digital signal based on an output from the sensor. Then, a distance between the LiDAR and the object to be measured is calculated based on, for example, a time difference from the laser light emission to a peak of the sensed reflected light. Since measurement data of the LiDAR is expected to be used for controlling a vehicle, for example, it is required to be able to detect a long-distance object with high resolution and to have high accuracy.

To manufacture the LiDAR at a low cost, the configuration is preferably as simple as possible. As a method for suppressing the cost, it is conceivable to suppress the cost of the optical system by a combination of a non-coaxial optical system and a 2D sensor.

Figure 22:
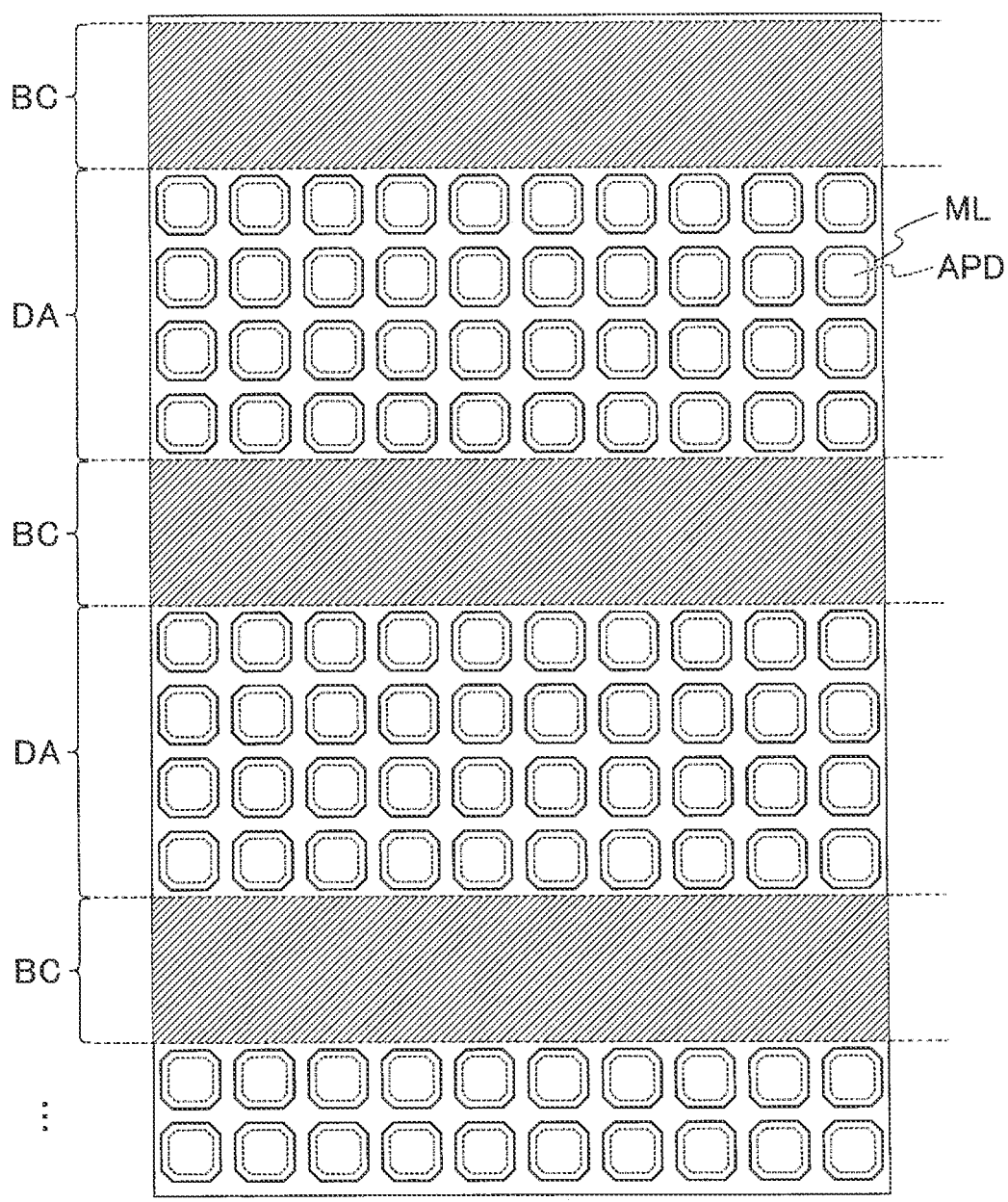
FIG. 22 depicts a plan view showing an example of a planar layout of a light detector according to a comparative example of the first embodiment.

FIG. 22 depicts a plan view showing an example of a planar layout of a light detector 32A according to a comparative example of the first embodiment, showing an example of an arrangement of pixels in the 2D sensor and control circuits of the pixels. As shown in FIG. 22, the light detector 32A includes pixel regions PA and belt-shaped circuits BC that are alternately arranged along the Y direction. The pixel region PA includes avalanche photodiodes APD (SPAD) arranged in a matrix, and a microlens ML is arranged so as to overlap each avalanche photodiode APD. The belt-shaped circuit BC includes control circuits of the avalanche photodiodes APD included in the pixel regions PA adjacent in the Y direction. Such a plurality of belt-shaped circuits BC are regions where light cannot be detected (also referred to as insensitive regions or blind spots), and cannot be covered by a microlens array MLA. That is, an aperture ratio of the light detector 32A as the 2D sensor decreases, which causes a decrease in reliability of LiDAR. Further, provision of an insensitive region means that there is a region that can never be detected in the scanning area SA, which is a monitoring range. Insensitive areas can be a fatal drawback in applications where oversight leads to serious accidents, such as in-vehicle applications.

On the other hand, the light detector 32 according to the first embodiment has a configuration in which an avalanche photodiode APD (sensor) is surrounded by a trench portion DT (separation structure), and control circuits of the avalanche photodiode APD are arranged around the trench portion DT. A deep well region DNW of a type different from an epitaxial layer (P-type semiconductor layer EP) on a semiconductor substrate SUB is provided around the trench portion DT. In the well region DNW, a P-type well region PW is provided in one portion (e.g., upper and lower portions) of the trench portion DT, and an N-type well region NW is provided in the other portion (e.g., right and left portions). Then, the well regions NW and PW are used so that, for example, a P-type transistor PM is provided on the first-side side of the trench portion DT, an N-type transistor NM is provided on the second-side side of the trench portion DT, and a diode DI is provided on the third-side side of the trench portion DT. These P-type transistor PM, N-type transistor NM, and diode DI are used to form the selection circuit 52 and the shift circuit 53 of each pixel PX.

Thereby, in the light detector 32 according to the first embodiment, an avalanche photodiode APD can be arranged in the central portion of a microlens ML, and a ratio of a light-receiving area covered by a microlens array MLA can be increased. Specifically, an aperture ratio of the light detector 32A according to the comparative example of the first embodiment is about 40%, whereas an aperture ratio of the light detector 32 according to the first embodiment is improved to about 80%. That is, the light detector 32 according to the first embodiment can increase an aperture ratio of the 2D sensor, and can increase the sensitivity of the sensor as compared with the light detector 32A. Further, since the light detector 32 according to the first embodiment does not have a belt-shaped circuit BC, the light-receiving area can be filled with sensitive regions. As a result, the light detector 32 according to the first embodiment can improve the reliability of detecting the target object TG.

A structure in which a sensor is surrounded by a trench portion DT has a function of not only separating light between inside and outside the region in which the sensor is arranged but also electrically separating the inside and outside the region. Thereby, circuit elements included in the pixel PX can be arranged closer to the sensor than in a case without the trench portion DT. Further, by maintaining a deep well region DNW at a voltage near a ground voltage, electric field concentration around the sensor is relaxed. As a result, the light detector 32 according to the first embodiment can maintain a withstand voltage of the sensor.

Further, since the light detector 32 according to the first embodiment is a 2D sensor, it is possible to reduce optical crosstalk noise and increase Vov (operation bias voltage of APD-breakdown voltage of APD). Specifically, the optical crosstalk is first reduced by the trench portion DT. However, when the trench portion DT is made of an insulator, a certain amount of light passes through the trench portion DT. In contrast, in the light detector 32 according to the first embodiment, the light that has passed through is less likely to reach other avalanche photodiodes APD for three reasons.

Figure 23:
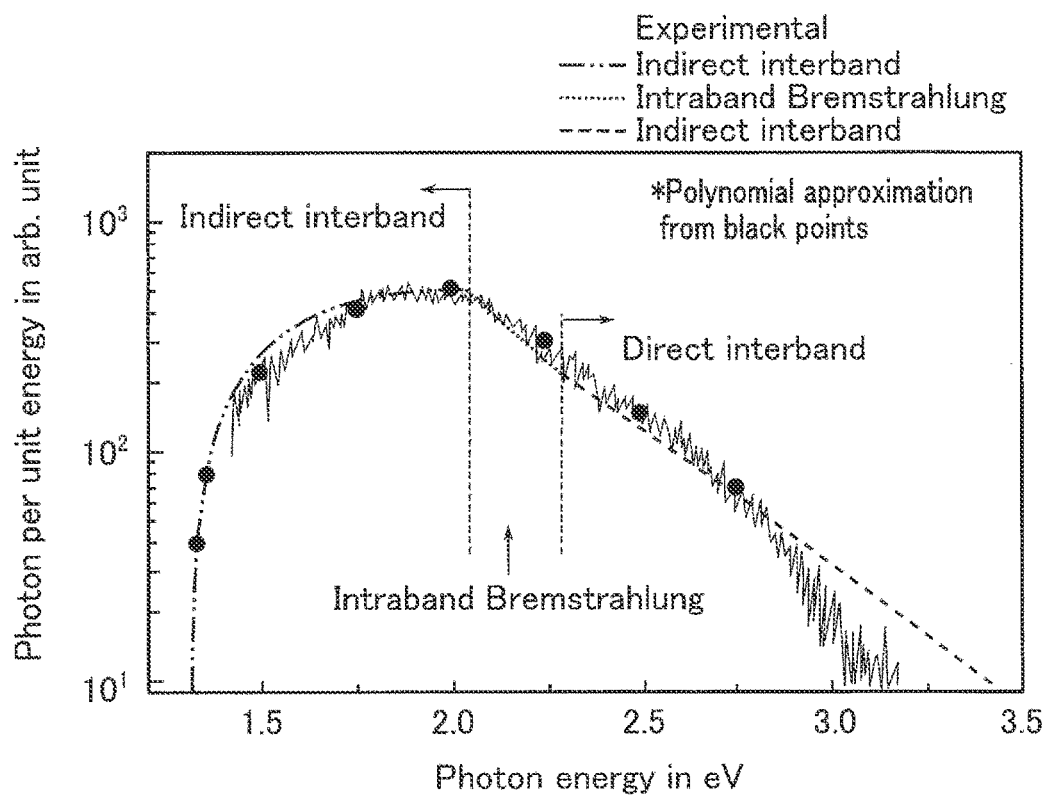
FIG. 23 depicts an explanatory diagram showing a wavelength dependency of a secondary light emission due to an avalanche phenomenon.

The first reason for reduced crosstalk is that there are two trench portions DT between adjacent avalanche photodiodes APD, which reduces the transmittance by approximately a power of two. FIG. 23 depicts an explanatory diagram showing a wavelength dependency of a secondary light emission due to an avalanche phenomenon which is the source of optical crosstalk. FIG. 23 cites N. Akil, et al, "A Multimechanism Model for Photon Generation by Silicon Junctions in Avalanche Breakdown," IEEE Trans. on Electron Devices vol. 46, No. 5 (1999): 1022-1028. As shown in FIG. 23, a wavelength dependency of a secondary light emission due to avalanche reduction has a peak at ~2 eV, which is a relatively short wavelength. Said wavelength dependency also has a longer wavelength emission, but much longer wavelength light is not absorbed as shown in the table in FIG. 23.

The second reason for the reduced crosstalk is that in the light detector 32 according to the first embodiment, a distance between adjacent avalanche photodiodes APD increases. This may allow the short wavelength light to be absorbed by the time it reaches an adjacent SPAD. For example, for light of ~2 eV, a ratio of light generated at the left end reaching an adjacent SPAD on the left side decreases from 23.8% (@3.44 um (micrometer)) to 4.29% (@7.54 um), decreasing by up to 18%.

Figure 24:
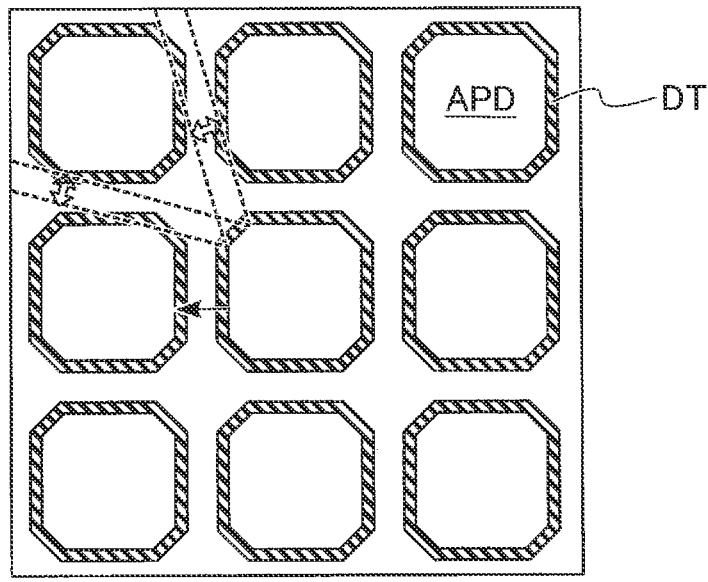
FIG. 24 depicts an explanatory diagram schematically showing light that reaches an avalanche photodiode in each of the comparative example and the first embodiment.
Figure 24:
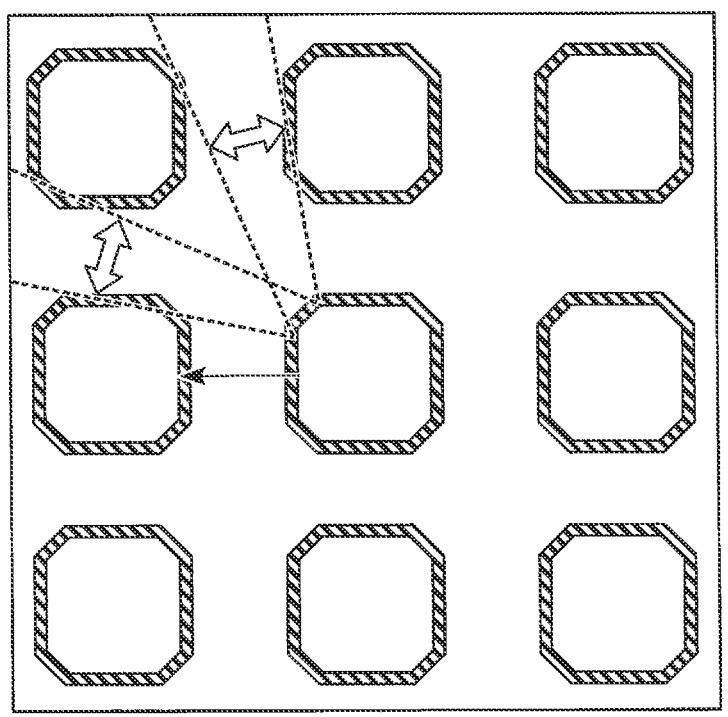

The third reason for the reduced crosstalk is that an amount of long-wavelength light that does not enter an adjacent SPAD increases. FIG. 24 depicts an explanatory diagram schematically showing light that reaches an avalanche photodiode in each of the comparative example and the first embodiment. Long wavelength light easily reaches an adjacent avalanche photodiode APD. For example, as shown in FIG. 24 (A), in the comparative example, since a distance between the avalanche photodiodes APD is short, long-wavelength light easily reaches adjacent avalanche photodiodes APD. On the other hand, as shown in FIG. 24 (B), in the first embodiment, since a distance between the avalanche photodiodes APD is larger than that of the comparative example, it is more difficult for long-wavelength light to reach the adjacent avalanche photodiodes APD than in the comparative example. That is, in the first embodiment, more light does not enter the adjacent avalanche photodiodes APD than in the comparative example.

For the above three reasons, the light detector 32 according to the first embodiment can reduce the optical crosstalk. As a result, the light detector 32 according to the first embodiment can increase the Vov, and the high Vov can increase the efficiency of detecting light.

In addition, the light detector 32 according to the first embodiment has a structure in which well regions NW and PW are regularly arranged around the trench portion DT, thereby optimizing the area efficiency of transistor arrangement. As a result, in the light detector 32 according to the first embodiment, circuit elements associated with a pixel PX are arranged in a well-balanced manner in the four directions around the pixel PX. Further, a semiconductor layer (polysilicon) that functions as a protection resistor Rs and a quench resistor Rq and a semiconductor layer (polysilicon) used as a gate electrode GE of a transistor can be arranged separately. As described above, in the light detector 32 according to the first embodiment, an interconnect used for connecting circuit elements included in a pixel PX can be optimally arranged along a signal flow, and an interconnect length can be shortened. As a result, the light detector 32 according to the first embodiment can arrange a plurality of pixels PX in a matrix at almost equal intervals. Furthermore, in the light detector 32 according to the first embodiment, since a microlens array MLA having microlenses ML arranged in a matrix and at equal intervals can cover the light-receiving area of the light detector 32, an aperture ratio can be improved without generating an insensitive region (blind spot).

Further, the pixel PX included in the light detector 32 according to the first embodiment has a configuration in which one end of the protection resistor Rs is coupled to the cathode of the avalanche photodiode APD, the other end of the protection resistor Rs is coupled to one end of each of the diode DI and the quench resistance Rq, the other end of the quench resistor Rq is coupled to the P-type transistor PM included in the selection circuit 52.

As a result, when a large amount of light is applied to the pixel PX and a very large number of carriers are generated, the carriers can be emitted at an early stage and can be recovered at an early stage. Further, the pixel PX, when in a non-selected (inactive state), can release extra carriers to the constant voltage node DOUT, and can avoid application of a high voltage to the transistor such as the selection circuit 52 by the voltage drop due to the protection resistor Rs. As a result, the pixel PX can omit the transistor for discharging the carrier when it is not selected, and the size of the pixel PX can be designed to be small. Therefore, as a sensor, the pixel PX can improve the substantial aperture ratio.

Further, the selection circuit 52 included in the pixel PX includes P-type transistors PM0 and PM1 coupled in series to the other end of the quench resistor Rq. Then, the P-type transistors PM0 and PM1 are coupled to the column selection line CSL and the row selection line RSL, respectively. As a result, the controller 10 of the distance measuring device 1 can select a pixel PX in the vertical direction (row direction) and a pixel PX in the horizontal direction (column direction), and selectively set the pixel PX in the light detector 32 to an active state. As a result, the light detector 32 according to the first embodiment can suppress power consumption.

In addition, the shift circuit 53 included in the pixel PX has a function of shifting a column selection signal in the horizontal direction. The shift circuit 53 can transmit a column selection signal to either one side or the other side in the horizontal direction according to the control of the controller 10. Further, the shift circuit 53 has a configuration in which the inverter 532 is coupled after the first shift circuit 531 for shifting to one side in the horizontal direction, and the inverter 534 is coupled after the second shift circuit 533 for shifting to the other side in the horizontal direction. The shift circuit 53 can maintain the quality of the column selection signal passed to the next pixel PX by transmitting the column selection signal via the inverters 532 and 534.

As a result, the light detector 32 can shift the arrangement of the pixels PX in the active area while suppressing the number of transistors. The controller 10 can bring inclined reflected light L2 that can be generated in the 2D optical system closer to the shape of the active area by appropriately using the shift function according to the scanning position. That is, by appropriately using a shift region, the number of on pixels can be set to the minimum, so that the power consumption of the light detector 32 can be suppressed. Further, such a shift circuit 53 can reduce the number of transistors, and can be efficiently mounted around the avalanche photodiode APD.

[2] Second Embodiment

A distance measuring device 1 according to a second embodiment realizes the same advantageous effects as those of the first embodiment by using an APD unit 51 having a circuit configuration different from that of the first embodiment. In the following, points different from the first embodiment will be described regarding the distance measuring device 1 according to the second embodiment.

[2-1] Circuit Configuration of Pixel PX

FIG. 25 depicts a circuit diagram showing an example of circuit configurations of APD units 51A and 51B and a selection circuit 52 included in a pixel PX included in a light detector 32 according to the second embodiment. As shown in FIG. 25, the pixel PX included in the light detector 32 according to the second embodiment has a circuit configuration in which the diodes DI0 and DI1 are replaced with Zener diodes TD0 and TD1, respectively, with respect to the pixel PX described in the first embodiment.

Specifically, the Zener diode TD0 is included in the APD unit 51A in which the diode DI0 is omitted. The Zener diode TD1 is included in the APD unit 51B in which the diode DI1 is omitted. The anode of the Zener diode TD0 is coupled to the node N0. The cathode of the Zener diode TD1 is coupled to the node N2. The anode of the diode TD1 is coupled to the node N1. The cathode of the diode TD1 is coupled to the node N2. The other circuit configurations of the pixel PX included in the light detector 32 according to the second embodiment are the same as those of the pixel PX included in the light detector 32 according to the first embodiment.

[2-2] Structure of Light Detector 32
[2-2-1] Planar Layout of Pixel PX

Figure 26:
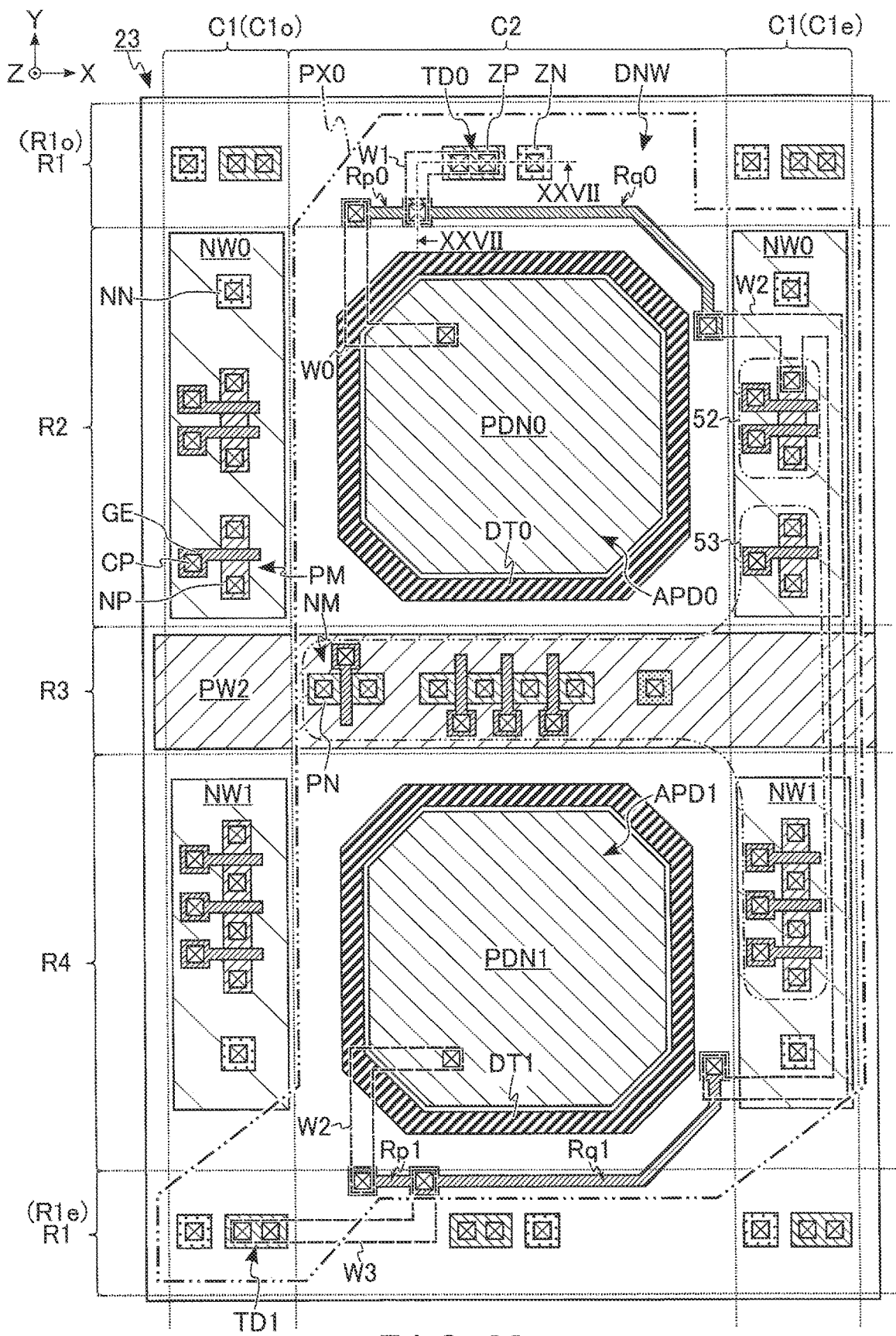
FIG. 26 depicts a plan view showing an example of a planar layout of a pixel included in the light detector according to the second embodiment.

FIG. 26 depicts a plan view showing an example of a detailed planar layout of a pixel PX included in the light detector 32 according to the second embodiment. FIG. 26 shows an area that overlaps with FIG. 16, displaying a planar layout of a region including the pixel PX0. As shown in FIG. 26, in the region where the pixel PX0 is formed, the light detector 32 according to the second embodiment has a configuration in which the well regions PW0 and PW1 are omitted and configurations related to the Zener diodes TD0 and TD1 are added in the light detector 32 described in the first embodiment.

Specifically, an N-type semiconductor region ZN and a P-type semiconductor region ZP are provided in the region (C2, R1) corresponding to the Zener diode TD0. Similarly, an N-type semiconductor region ZN and a P-type semiconductor region ZP are provided in the region (C1, R1) corresponding to the Zener diode TD1. Each of the N-type semiconductor region ZN and the P-type semiconductor region ZP is formed in the well region DNW. The concentration of N-type impurities contained in the N-type semiconductor region ZN is higher than that of N-type impurities contained in the well region DNW. The concentration of P-type impurities contained in the P-type semiconductor region ZP is higher than that of N-type impurities contained in the well region DNW. A contact plug CP is coupled to each of the N-type semiconductor region ZN and the P-type semiconductor region ZP.

The contact plug CP coupled to the N-type semiconductor region ZN in the region (C2, R1) is coupled to, for example, the interconnect W1. The contact plug CP coupled to the P-type semiconductor region ZP in the region (C2, R1) is coupled to the node N2 (the N-side electrode of the Zener diode TD0). The contact plug CP coupled to the N-type semiconductor region ZN in the region (C1, R1) is coupled to, for example, the interconnect W3. The contact plug CP coupled to the P-type semiconductor region ZP in the region (C1, R1) is coupled to the node N2 (the N-side electrode of the Zener diode TD1). In the light detector 32 according to the second embodiment, the well regions NW0 and NW1 and the N-side electrodes of the Zener diodes TD0 and TD1 are electrically coupled.

The other planar layout of the light detector 32 according to the second embodiment is the same as the planar layout of the light detector 32 according to the first embodiment. In this example, there are two contact plugs CP that couple the N-type semiconductor region ZN and the interconnect W1. As described above, the number of contact plugs CP for coupling a semiconductor region and an interconnect may be two or more. Note that the shape of the pixel PX in the second embodiment may be other shapes in the same manner as in the first embodiment. For example, the shape of the pixel PX shown in FIG. 26 may be inverted right and left, upside down, or both right and left and upside down. The shape of the pixel PX in the second embodiment can be changed appropriately according to the arrangement of the circuit elements included in the pixel PX.

[2-2-2] Cross-Sectional Structure of Pixel PX

Figure 27:
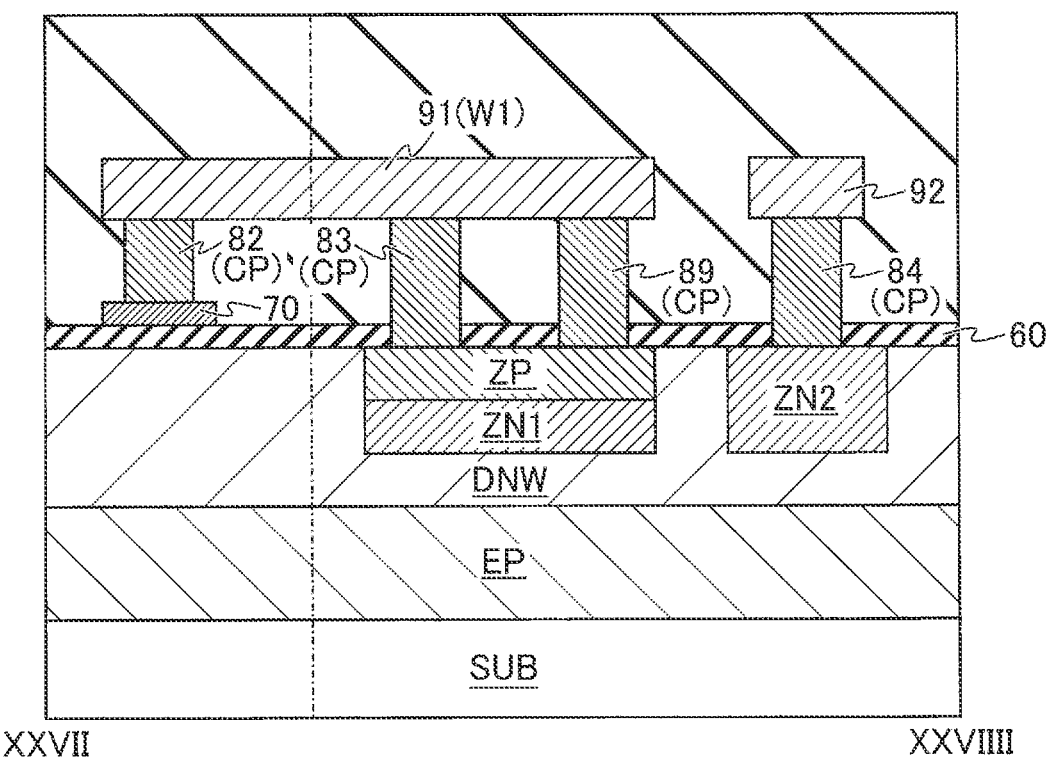
FIG. 27 depicts a cross-sectional view, taken along line XXVII-XXVII in FIG. 26, showing an example of a cross-sectional structure of the pixel included in the light detector according to the second embodiment.

FIG. 27 depicts a cross-sectional view, taken along line XXVII-XXVII in FIG. 26, showing an example of a cross-sectional structure of the pixel PX included in the light detector 32 according to the second embodiment. FIG. 27 shows a cross section including a coupling portion between the Zener diode TD and the protection resistor Rs. A dashed line shown in FIG. 27 shows a curved portion of the cross section along the XXVII-XXVII line. As shown in FIG. 27, in the cross section including the coupling portion between the Zener diode TD and the protection resistor Rs, the light detector 32 includes, for example, a semiconductor substrate SUB, a P-type semiconductor layer EP, a well region DNW, N-type semiconductor regions ZN1 and ZN2, a P-type semiconductor region ZP, an insulator layer 60, a conductor layer 70, contact plugs 82, 83, 84, and 89, and conductor layers 91 and 92.

Specifically, in the illustrated region, the P-type semiconductor layer EP is provided on the semiconductor substrate SUB. The well region DNW is provided on the P-type semiconductor layer EP. A set of the P-type semiconductor region ZP and the N-type semiconductor region ZN1 and the N-type semiconductor region ZN2 are respectively provided in the vicinity of an upper surface of the well region DNW. The N-type semiconductor region ZN1 is provided between the P-type semiconductor region ZP and the well region DNW. Each of the well region DNW, the P-type semiconductor region ZP, and the N-type semiconductor regions ZN1 and ZN2 is formed based on an epitaxial layer formed on the semiconductor substrate SUB. Then, the upper surfaces of the well region DNW, the P-type semiconductor region ZP, and the N-type semiconductor region PN2 are aligned.

The insulator layer 60 is provided on each of the well region DNW, the P-type semiconductor region ZP, and the N-type semiconductor region ZN2. The conductor layer 70 is provided on the insulator layer 60. The conductor layer 71 corresponds to the other end of the protection resistor Rs. The contact plug 82 is provided on the conductor layer 70. Each of the contact plugs 83 and 89 is provided on the P-type semiconductor region ZP, and penetrates the insulator layer 60. The contact plug 84 is provided on the N-type semiconductor region ZN2, and penetrates the insulator layer 60. The conductor layer 91 is provided on the contact plugs 82, 83 and 89, and couples between the contact plug 82 and the contact plugs 83 and 89. The conductor layer 91 corresponds to the interconnect W1. The conductor layer 92 is provided on the contact plug 84, and is coupled to the node N2. Other configurations and structures of the distance measuring device 1 according to the second embodiment are the same as those of the distance measuring device 1 according to the first embodiment.

[2-3] Advantageous Effects of Second Embodiment

As described above, the light detector 32 according to the second embodiment uses a Zener diode TD as a diode coupled between a protection resistor Rs and a quench resistor Rq. The Zener diode TD is formed by utilizing a deep well region DNW. The electrode on the N side of the Zener diode is, for example, electrically coupled to a power supply of the P-type transistor PM.

Even in such a case, the Zener diode TD can realize the same rectifying effect as that of the diode DI described in the first embodiment. As a result, the light detector 32 according to the second embodiment can improve the performance of the light detector 32 in the same manner as in the first embodiment. Further, in the light detector 32 according to the second embodiment, an output terminal of the Zener diode TD can also serve as a power supply node VDD, and an interconnect space, etc. can be saved.

[3] Others

FIG. 28 depicts a plan view showing an example of a planar layout of a light receiver 30 included in a light detector 32B according to a first modification of the first embodiment. As shown in FIG. 28, the light detector 32B includes light-receiving areas DA arranged in a matrix. A circuit region CR is arranged between adjacent light-receiving areas DA. One microlens ML is arranged so as to overlap each light-receiving area DA. In the light detector 32B, a pixel PX including four avalanche photodiodes APD is arranged so as to overlap one microlens ML. In the light detector 32B, each of the plurality of avalanche photodiodes APD included in one pixel PX is surrounded by an individual trench portion DT. A distance between the trench portions DT that overlap the same microlens ML is the minimum distance allowed by the design rules. Then, in the light detector 32B, for example, a well region DNW is provided in a portion not surrounded by the trench portion DT. The selection circuit 52 and the shift circuit 53 of each pixel PX are arranged in adjacent circuit region CR portions. The circuit region CR has a horizontally elongated region (referred to as CRA), a vertically elongated region (referred to as CRB), and a region where they intersect. For example, a well region containing P-type impurities may be arranged in the CRA, and a well region containing N-type impurities may be arranged in the CRB. In addition, the height of each CRA may be designed to be equal, or the width of each CRB may be designed to be equal. Further, the selection and shift circuits of each light-receiving area may be arranged at relatively the same positions as in each light-receiving area to exhibit translational symmetry.

FIG. 29 depicts a plan view showing an example of a planar layout of a light receiver 30 included in a light detector 32C according to a second modification of the first embodiment. The light detector 32C has a different trench portion DT design than the light detector 32B. Specifically, in the light detector 32C, each of a plurality of avalanche photodiodes APD included in one pixel PX is surrounded by a trench portion DT provided continuously while separating each avalanche photodiode APD. Other configurations of the light detector 32C are similar to those of the light detector 32B. The circuit region CR has a horizontally elongated region (hereinafter referred to as CRA), a vertically elongated region (hereinafter referred to as CRB), and a region where they intersect. For example, a well region containing P-type impurities may be arranged in the CRA, and a well region containing N-type impurities may be arranged in the CRB. In addition, the height of each CRA may be designed to be equal, or the width of each CRB may be designed to be equal. Further, the selection and shift circuits of each light-receiving area may be arranged at relatively the same positions as in each light-receiving area to exhibit translational symmetry.

Like each of the light detectors 32B and 32C described above, the microlens ML may not necessarily be provided for each avalanche photodiode APD. In other words, one microlens ML may be provided so as to cover adjacent avalanche photodiodes APD. Each of the planar layout of the light receiver 30 in the first modification of the first embodiment and the planar layout of the light receiver 30 in the second modification of the first embodiment may be combined with the second embodiment.

In FIGS. 28 and 29, the center or center of gravity of the avalanche photodiodes APD included in the same microlens ML is almost equal to the center of the microlens ML. Then, the avalanche photodiodes APD included in the same microlens ML are gathered as close to the center of the microlens ML as possible. With these characteristics, the light is focused near the center by the microlens ML, so that the light easily enters the avalanche photodiode APD. In particular, in the case of FIG. 29, since the distance between adjacent avalanche photodiodes APD is small, a large amount of light enters the avalanche photodiodes APD, and high sensitivity can be obtained. On the other hand, since the light-irradiated region of each light-receiving area is separated from the well region by focusing, optical crosstalk between the pixels is suppressed. Further, since relative positions of the circuits of each pixel PX are equal, the characteristics of the pixels PX become uniform. Further, since the P-type well region is gathered in the CRA and the N-type well region is gathered in the CRB, the transistors can be arranged in an area-efficient manner, and the resolution can be further increased.

In addition, in each of the light detectors 32B and 32C described above, the case where four avalanche photodiodes APD are arranged for one microlens ML has been exemplified, but the number of avalanche photodiodes APD covered by one microlens ML can be freely designed. Further, in the above descriptions, the case where one pixel PX is arranged for one microlens ML has been exemplified, but the number of pixels PX covered by one microlens ML can be freely designed. Each avalanche photodiode APD may be surrounded by a trench portion DT so that at least adjacent avalanche photodiodes APD are separated from each other. The trench portion DT may be provided continuously or may be provided in a divided manner.

In the above embodiments, the case where the controller 10 reports the emission time T1 of the outgoing light L1 to the measurement section 40 has been exemplified, but the present invention is not limited thereto. The emission time T1 may be set based on a time when the outgoing light L1 is dispersed in the emission section 20 and the dispersed outgoing light L1 is detected by a sensor provided in the light receiver 30. In this case, the emission time T1 is reported from the light receiver 30 to the measurement section 40.

The category of each configuration of the distance measuring device 1 may be other categories. The measurement section 40 may be other categories as long as it can realize the operations described in the above embodiments. The CPU included in the controller 10 may be other circuits. For example, in place of the CPU, a micro processing unit (MPU), etc. may be used. In addition, each of the processes described in each embodiment may be realized by dedicated hardware. Processes executed by software and processes executed by hardware may be mixed, or either one of them may exist. In each embodiment, in the flowchart used for describing the operations, the order of processes may be interchanged as far as possible, and other processes may be added.

In the present specification, the "active area" may also be referred to as a light-receiving area. The outgoing light L1 emitted by the light source 23 into which a pulse signal is input based on control of the controller 10 may be referred to as a pulse signal. The "emission section 20" may be referred to as a "light emitter". An "H" level voltage is a voltage at which an N-type transistor enters an ON state when said voltage is applied to its gate, and a P-type transistor enters an OFF state when said voltage is applied to its gate. An "L" level voltage is a voltage at which an N-type transistor enters an OFF state when said voltage is applied to its gate, and a P-type transistor enters an ON state when said voltage is applied to its gate. Each of the "L" level and the "H" level may be expressed as a logic level. The "conductive type" corresponds to the "N type" or the "P type". The "surround" may enclose at least on a plane (XY plane) parallel to a surface of a semiconductor substrate SUB. Whether or not a microlens ML covers an avalanche photodiode APD can be determined based on, for example, an overlapping portion in the Z direction. Whether or not a microlens ML covers an avalanche photodiode APD may be determined depending on whether or not the microlens ML covers a portion surrounded by a trench portion DT surrounding the avalanche photodiode APD. A "two-dimensionally arranged avalanche photodiode APD" may include at least a plurality of avalanche photodiodes arranged in the column direction and a plurality of avalanche photodiodes arranged in the row direction. A "selected pixel PX" corresponds to a pixel PX in an active state.

In the present specification, the term "couple/connect" refers to electrical coupling, and does not exclude intervention of, for example, another element. An "upper surface" corresponds to a surface on a side where a circuit element is formed in a semiconductor substrate SUB, and corresponds to a surface on a side far from the semiconductor substrate SUB in other configurations. An "ON state" refers to a state in which the gate of a relevant transistor has a voltage equal to or greater than a threshold voltage of the transistor being applied. An "OFF state" refers to a state in which the gate of a relevant transistor has a voltage below a threshold voltage of the transistor being applied, and does not exclude, for example, a state in which a minute electric current such as a leakage current of the transistor flows. A "current path of a transistor" corresponds to a channel of the transistor. Each of "one end and the other end of a current path of a transistor" and "one end and the other end of a transistor" corresponds to the drain or source of the transistor. A "pixel PX" may also be referred to as a sensor circuit. An "avalanche photodiode APD" may also be referred to as a sensor. A "diode DI" may also be referred to as a rectifying diode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light detector comprising:
   a substrate;
   a plurality of avalanche photodiodes provided above the substrate, each of the avalanche photodiodes being surrounded by a trench portion among a plurality of trench portions;
   a first well region provided between the trench portions that are adjacent to each other, the first well region surrounding a side surface of the trench portion;
   a second well region provided near an upper surface of the first well region, the second well region including at least one of a transistor and a diode; and
   a microlens array provided to cover the avalanche photodiodes.

2. The light detector of claim 1, wherein each of the avalanche photodiodes includes a first semiconductor layer of a first conductive type and a second semiconductor layer of a second conductive type different from the first conductive type, the second semiconductor layer being provided on the first semiconductor layer, a side surface of the first semiconductor layer and a side surface of the second semiconductor layer being surrounded by the trench portion.

3. The light detector of claim 1, wherein
   the microlens array includes a plurality of microlenses, and
   the microlenses are provided to cover the avalanche photodiodes, respectively.

4. The light detector of claim 1, wherein
   the microlens array includes a microlens, and
   the microlens covers the avalanche photodiodes that are adjacent to each other.

5. A light detector comprising:
a first avalanche photodiode arranged two-dimensionally;
a first resistor, one end of the first resistor being coupled to a cathode of the first avalanche photodiode;
a first diode coupled to another end of the first resistor;
a second resistor, one end of the second resistor being coupled to the another end of the first resistor; and
a first transistor coupled to another end of the second resistor.

6. The light detector of claim 5, further comprising a plurality of sensor circuits, wherein
each of the sensor circuits includes the first avalanche photodiode, the first resistor, the first diode, the second resistor, the first transistor, and a second transistor,
one end of the first transistor is coupled to the another end of the second resistor,
another end of the first transistor is coupled to one end of the second transistor,
a first selection signal is input to a gate of the first transistor,
a second selection signal is input to a gate of the second transistor, and
a row address is assigned to a plurality of sensor circuits arranged in a first direction, a column address is assigned to a plurality of sensor circuits arranged in a second direction different from the first direction, and at least one of the sensor circuits is selected based on the first selection signal and the second selection signal.

7. The light detector of claim 6, wherein
the sensor circuits include a first sensor circuit, a second sensor circuit, a third sensor circuit, and a fourth sensor circuit,
the first sensor circuit and the second sensor circuit are adjacent in the second direction,
the second sensor circuit is sandwiched between the third sensor circuit and the fourth sensor circuit in the first direction, and
the first sensor circuit further includes a shift circuit, the shift circuit being configured to transfer a first selection signal or a second selection signal input to the first sensor circuit to any one of the second sensor circuit, the third sensor circuit, and the fourth sensor circuit.

8. The light detector of claim 5, wherein
the first diode is a rectifying diode whose cathode is coupled to the another end of the first resistor.

9. The light detector of claim 5, wherein
the first diode is a Zener diode whose anode is coupled to the another end of the first resistor.

10. The light detector of claim 5, further comprising:
a second avalanche photodiode;
a third resistor, one end of the third resistor being coupled to a cathode of the second avalanche photodiode;
a second diode coupled to the another end of the second resistor; and
a fourth resistor, one end of the fourth resistor being coupled to the another end of the second resistor, another end of the fourth resistor being coupled to the first transistor.

11. The light detector of claim 5, wherein
the first resistor functions as a protection resistor of a sensor circuit including the first avalanche photodiode, and
the second resistor functions as a quench resistor of the sensor circuit.

12. The light detector of claim 6, wherein
when each of a first selection signal and a second selection signal for a selected sensor circuit becomes a first logic level, a first avalanche photodiode included in the selected sensor circuit enters an active state capable of detecting light.

13. The light detector of claim 12, wherein
in the selected sensor circuit, a voltage applied to an anode of the first avalanche photodiode is higher than a voltage applied to a cathode of the first avalanche photodiode.

14. A light detector comprising:
a substrate of a first conductive type;
a first semiconductor layer of the first conductive type, the first semiconductor layer being provided above the substrate;
a second semiconductor layer of a second conductive type different from the first conductive type, the second semiconductor layer being provided on the first semiconductor layer;
a first insulator that is annular and surrounds side surfaces of the first semiconductor layer and the second semiconductor layer;
a first well region of the second conductive type, the first well region being provided above the substrate and so as to surround a side surface of the first insulator; and
at least one well region provided near an upper surface of the first well region, wherein
a transistor and a diode are provided in the at least one well region.

15. The light detector of claim 14, wherein
the first well region includes a second well region, a third well region, and a fourth well region, the second well region being adjacent to the first insulator in a first direction, the third well region being adjacent to the first insulator in a second direction, and the fourth well region being adjacent to the first insulator in a third direction,
an N-type transistor is provided in the second well region,
a P-type transistor is provided in the third well region, and
a diode is provided in the fourth well region.

16. The light detector of claim 14, further comprising a plurality of sensor portions arranged in a matrix, each of the sensor portions including the first insulator, the first semiconductor layer, and the second semiconductor layer.

17. The light detector of claim 16, further comprising a plurality of microlenses arranged at equal intervals, the microlenses being respectively provided above the sensor portions.

18. The light detector of claim 14, further comprising:
an insulator layer provided on the first well region; and
a semiconductor layer provided on the insulator layer, the semiconductor layer including a portion provided along a shape of the second semiconductor layer, wherein
one end portion of the semiconductor layer is coupled to the second semiconductor layer via at least one contact plug,
a middle portion of the semiconductor layer is coupled to the diode via at least one contact plug, and
another end portion of the semiconductor layer is coupled to the transistor via at least one contact plug.

19. The light detector of claim 18, wherein
a well region in which the diode is provided is the first conductive type, the well region including a first semiconductor region and a second semiconductor region near an upper surface of the well region, the first semiconductor region being the second conductive type, and an impurity concentration of the first conductive type being higher in the second semiconductor region than in the well region, the first semiconductor region is coupled to the middle portion of the semiconductor layer via at least one contact plug, and the second semiconductor region is coupled to a constant voltage node via at least one contact plug.

20. The light detector of claim 19, wherein the first conductive type is a P type, and the second conductive type is an N type.

\* \* \* \* \*